(12) United States Patent
Suganuma et al.

(10) Patent No.: US 9,743,510 B2
(45) Date of Patent: Aug. 22, 2017

(54) SUBSTRATE, IMAGING UNIT AND IMAGING DEVICE

(71) Applicant: NIKON CORPORATION, Tokyo (JP)

(72) Inventors: Ryoichi Suganuma, Yokohama (JP); Hirofumi Arima, Tokyo (JP); Satoru Suzuki, Yokohama (JP); Takuya Sato, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 14/579,108

(22) Filed: Dec. 22, 2014

(65) Prior Publication Data

US 2015/0181698 A1 Jun. 25, 2015

Related U.S. Application Data

(63) Continuation of application No. PCT/JP2013/001678, filed on Mar. 13, 2013.

(30) Foreign Application Priority Data

Jun. 22, 2012 (JP) ................................ 2012-141508
Aug. 10, 2012 (JP) ................................ 2012-177980
Aug. 10, 2012 (JP) ................................ 2012-179095

(51) Int. Cl.
*H01L 29/16* (2006.01)
*H05K 1/02* (2006.01)
(Continued)

(52) U.S. Cl.
CPC ...... *H05K 1/0271* (2013.01); *H01L 27/14618* (2013.01); *H01L 27/14636* (2013.01); *H04N 5/2253* (2013.01); *H05K 1/0283* (2013.01); *H05K 1/05* (2013.01); *H05K 1/056* (2013.01); *H05K 1/111* (2013.01); *H05K 1/181* (2013.01); *H05K 3/4608* (2013.01); *H01L 2224/48091* (2013.01); *H01L 2224/48227* (2013.01); *H01L 2924/16195* (2013.01); *H05K 1/0206* (2013.01);
(Continued)

(58) Field of Classification Search
CPC ...... H05K 1/0271; H05K 1/181; H05K 1/111; H05K 1/0283; H05K 1/05; H01L 27/14636
See application file for complete search history.

(56) References Cited

U.S. PATENT DOCUMENTS

| 7,646,427 | B2 | 1/2010 | Sato et al. |
| 2005/0161587 | A1 | 7/2005 | Mihara et al. |
| 2013/0149514 | A1* | 6/2013 | Hayashi ................. B32B 27/14 |
| | | | 428/213 |

FOREIGN PATENT DOCUMENTS

| JP | 2003-110892 A | 4/2003 |
| JP | 2003-234926 A | 8/2003 |

(Continued)

OTHER PUBLICATIONS

Feb. 12, 2016 Extended Search Report issued in European Patent Application No. 13806277.3.
(Continued)

*Primary Examiner* — Tony Ko
(74) *Attorney, Agent, or Firm* — Oliff PLC

(57) ABSTRACT

A substrate comprises: a first insulating layer; a second insulating layer having an elastic modulus that is different from an elastic modulus of the first insulating layer; and a core layer that is sandwiched by the first insulating layer and the second insulating layer, and is more rigid than the first insulating layer and the second insulating layer.

21 Claims, 26 Drawing Sheets

(51) Int. Cl.
| | |
|---|---|
| *H04N 5/225* | (2006.01) |
| *H05K 1/05* | (2006.01) |
| *H05K 3/46* | (2006.01) |
| *H01L 27/146* | (2006.01) |
| *H05K 1/11* | (2006.01) |
| *H05K 1/18* | (2006.01) |
| *H05K 3/44* | (2006.01) |
| *H05K 1/03* | (2006.01) |

(52) U.S. Cl.
CPC ......... *H05K 1/0366* (2013.01); *H05K 3/445* (2013.01); *H05K 2201/0133* (2013.01); *H05K 2201/068* (2013.01); *H05K 2201/10015* (2013.01); *H05K 2201/10121* (2013.01)

(56) References Cited

FOREIGN PATENT DOCUMENTS

| JP | 2007-028430 A | 2/2007 |
|---|---|---|
| JP | 2007-150101 A | 6/2007 |
| JP | 2011-009403 A | 1/2011 |
| JP | 2011-059272 A | 3/2011 |
| JP | 2012-028496 A | 2/2012 |
| WO | 2012/014875 A1 | 2/2012 |

OTHER PUBLICATIONS

Jun. 11, 2013 International Search Report issued in International Application No. PCT/JP2013/001678.
Dec. 23, 2014 International Preliminary Report on Patentability issued in International Application No. PCT/JP2013/001678.
Jan. 17, 2017 Office Action issued in Japanese Patent Application No. 2014-520869.
Nov. 22, 2016 Office Action issued in Chinese Patent Application No. 201380043799.6.
May 16, 2017 Office Action issued in Japanese Patent Application No. 2014-520869.

* cited by examiner

SUBSTRATE, IMAGING UNIT AND IMAGING DEVICE

CROSS REFERENCE TO RELATED APPLICATION

The contents of the following Japanese and International patent applications are incorporated herein by reference:
2012-141508 filed in JP on Jun. 22, 2012;
2012-177980 filed in JP on Aug. 10, 2012;
2012-179095 filed in JP on Aug. 10, 2012; and
PCT/JP2013/001678 filed on Mar. 13, 2013.

BACKGROUND

1. Technical Field

The present invention relates to a substrate, an imaging unit and an imaging device.

2. Related Art

An imaging device in which a connector placed in a substrate of an imaging unit and a connector placed in a main circuit substrate are connected via a conductive member is known. Also, a multilayered substrate in which interconnection patterns are formed as a multilayer is known. In particular, a metal core substrate adopting a metal layer for a core layer is known. An insulating resin layer is formed on the front and back of the metal layer.

PRIOR ART LITERATURES

Patent Literature

[Patent Literature 1] Japanese Patent Application Publication No. 2011-59272
[Patent Literature 2] Japanese Patent Application Publication No. 2012-028496

As a material of an insulating resin layer in a metal core substrate, a material having a high elastic modulus such as FR (Flame Retardant Type) 4 is used. When an imaging chip is mounted on such a metal core substrate, the metal core substrate and the imaging chip are bonded in a heated state in some cases. In this case, a highly elastic insulating resin layer is deformed due to thermal expansion or contraction of an interconnection pattern of each layer. As a result, a warp occurs to the metal core substrate.

In some cases, contact failure of a conductive member is caused due to a contact resistance that occurs between contact surfaces of a substrate of an imaging unit and a connector placed in the substrate.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

First Embodiment

Figure 1:
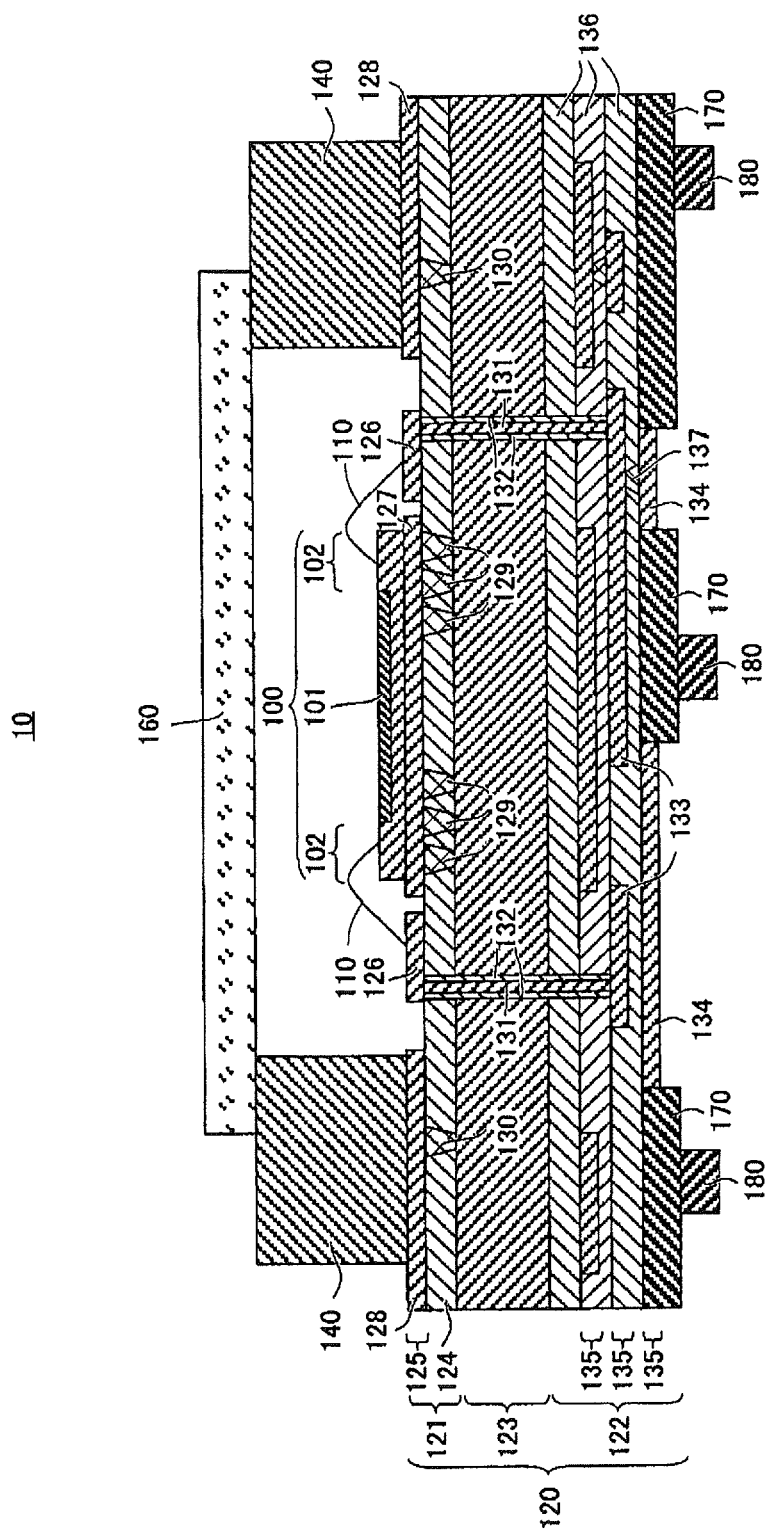
FIG. 1 is a schematic sectional view of an imaging unit.

FIG. 1 is a schematic sectional view of an imaging unit 10 according to a first embodiment. The imaging unit 10 is configured to include an imaging chip 100, a core substrate 120, a surrounding member 140, a cover glass 160 as one example of an optical element, and electronic parts 180.

The imaging chip 100 is configured to include an imaging area 101 and a circuit area 102. The imaging area 101 is formed at a central portion of the imaging chip 100. The imaging area 101 has a plurality of pixels that perform photoelectric conversion on a received light of a subject image. The circuit area 102 is formed in the periphery of the imaging area 101. The circuit area 102 has a processing circuit that performs signal processing of a pixel signal obtained by performing the photoelectric conversion. The processing circuit includes an AD converting circuit that converts an analog pixel signal into a digital signal.

The core substrate 120 is a metal core substrate. Specifically, the core substrate 120 is configured to include a first layer 121, a second layer 122, and a core layer 123. The first layer 121 and the second layer 122 have different elastic moduluses, and this is described below in detail. The core layer 123 is sandwiched by the first layer 121 and the second layer 122 having mutually different elastic moduluses. The thickness of the core substrate 120 as a whole is approximately 0.8 mm to 3 mm.

The first layer 121 includes an insulating layer 124, and an interconnection pattern 125 formed on a surface of the insulating layer 124. The interconnection pattern 125 includes an interconnection 126, an interconnection 127, and an interconnection 128. The thickness of the interconnection pattern 125 is approximately 30 μm to 40 μm. The interconnection 126 is electrically connected to the imaging chip 100 by bonding wires 110. The imaging chip 100 is mounted on the interconnection 127, and the surrounding member 140 is firmly attached to the interconnection 128. The insulating layer 124 is a prepreg layer as one example.

The insulating layer 124 of the first layer 121 is formed by a material having an elastic modulus lower than that of a material of insulating layers 136 of the second layer 122 described below. The material having a low elastic modulus is specifically a material having an elastic modulus of 20 GPa or lower. The elastic modulus of the material having a low elastic modulus is preferably 15 GPa or lower. The elastic modulus is more preferably 10 GPa or lower. Furthermore, the elastic modulus is more preferably 5 GPa or lower. The elastic modulus is most preferably 0.3 GPa to 1.3 GPa. A thermosetting resin can be used as the material having a low elastic modulus. The insulating layer 124 may be configured with, as the material having a low elastic modulus, a composite material formed by impregnating a glass cloth with a thermosetting resin. In this case, the elastic modulus of the composite material as a whole is defined.

The core layer 123 is a metal core. An alloy of nickel and iron (for example, 42Alloy or 56Alloy), copper, aluminum, or the like can be used as a material of the core layer 123. Here, the elastic moduluses of the alloy of nickel and iron, aluminum, and copper are approximately 150 GPa, 130 GPa, and 70 GPa, respectively. The thickness of the core layer 123 is larger than the thickness of the interconnection pattern 125 of the first layer 121 and interconnection patterns 135 of the second layer 122 described below. Specifically, the thickness is approximately 0.1 mm to 0.4 mm. For this reason, the rigidity of the core layer 123 is higher than the rigidity of the first layer 121 and the second layer 122. The core layer 123 is distinguished from the interconnection pattern 125 of the first layer 121 and the interconnection patterns 135 of the second layer 122 in terms of the heat dissipating properties and rigidity. More specifically, the core layer 123 is distinguished from the interconnection pattern 125 and the interconnection patterns 135 in that the core layer 123 can serve a function of dissipating heat generated in the imaging chip 100, and a function of retaining other members by making use of its high rigidity.

The second layer 122 includes the insulating layers 136, and three layers of the interconnection patterns 135 formed inside the insulating layers 136 and on a surface, of the insulating layer 136, that is on the side opposite to the core layer 123. The interconnection patterns 135 include an interconnection 133 and an interconnection 134. The thickness of the interconnection pattern 135 is approximately 30 μm to 40 μm. A part of a surface, of the second layer 122, that is on the side opposite to the core layer 123 is protected by a solder resist 170. The insulating layers 136 of the second layer 122 are formed by a material having an elastic modulus higher than that of a material of the insulating layer 124 of the first layer 121. The material having a high elastic modulus is a material having an elastic modulus of approximately 35 GPa to 40 GPa. The insulating layers 136 are prepreg layers as one example.

The interconnection 126 and the interconnection 133 are electrically connected by a via 131. The via 131 is covered by an insulator 132. A pixel signal output from the imaging chip 100 is transmitted to the interconnection 133 via the interconnection 126 and the via 131.

Here, the elastic moduluses of the first layer 121 and the second layer are compared. In particular, when the quality of the material of the interconnection pattern 125 and the quality of the material of the interconnection patterns 135 are the same, a difference between the elastic moduluses of the materials of the insulating layer 124 and the insulating layers 136 emerges as a difference between the elastic moduluses of the first layer 121 and the second layer.

The surrounding member 140 surrounds the imaging chip 100. Metal such as aluminum, brass, iron, nickel alloy, or the like can be used as a material of the surrounding member 140. Also, resin can be used as the material of the surrounding member 140, and a material formed by insert molding of metal and resin can be used. By using metal or a material formed by insert molding of metal and resin as the material of the surrounding member 140, the surrounding member 140 can be used as a radiator.

The cover glass 160 covers the imaging chip 100. Borosilicate glass, quartz glass, non-alkali glass, heat-resistant glass or the like can be used as a material of the cover glass 160. The cover glass 160 is firmly attached to the surrounding member 140.

The core substrate 120, the surrounding member 140, and the cover glass 160 form a sealed space. The imaging chip 100 is placed within the sealed space.

The electronic parts 180 are a capacitor, a register, a resistance or the like for example. These electronic parts 180 configure a power supply circuit that supplies electrical power to a circuit within the imaging chip 100, or the like. The electronic parts 180 are mounted on a surface, of the second layer 122, that is on the side opposite to the core layer 123. The electronic parts 180 and the interconnection 134 of the second layer 122 are electrically connected by solder. A connector may be further mounted on a surface, of the second layer 122, that is on the side opposite to the core layer 123. The connector is connected for example with a flexible substrate. In this case, a pixel signal transmitted to the interconnection 133 is transmitted to the interconnection 134 via a via 137, and then is transmitted to an external processing circuit via the connector and the flexible substrate.

The surface flatness of the first layer 121 in the imaging unit 10 is explained. Due to heat that is applied at the time of bonding between the imaging chip 100 and the core substrate 120, the interconnection pattern 135 of each layer in the second layer 122 experiences thermal expansion or contraction. Due to the thermal expansion or contraction of the interconnection pattern 135 of each layer, the insulating layers 136 are also deformed. Because a material having a high elastic modulus is used for the insulating layers 136, stress generated in the interconnection pattern 135 of each layer is not absorbed so much by the insulating layers 136. Then, the stress generated in the interconnection pattern 135 of each layer reaches the first layer 121. On the other hand, because the surrounding member 140 is configured with a material having a high elastic modulus, the surrounding member 140 generates stress in a direction to remain at the bonded part against the stress acting on the first layer 121. If the insulating layer 124 of the first layer 121 is formed with a material having a high elastic modulus, the stress of the interconnection patterns 135 and the stress of the surrounding member 140 cannot be absorbed, and the first layer 121 may peel off the surrounding member 140.

Because in the imaging unit 10 according to the first embodiment, the insulating layer 124 of the first layer 121 is configured with a material having a low elastic modulus, the stress generated in the second layer 122 and the stress generated in the surrounding member 140 can be absorbed. Accordingly, a warp of the front surface of the first layer 121, that is, a surface where the imaging chip 100 is mounted can be reduced. Because, thereby, a warp of the imaging chip 100 itself can be reduced, a favorable image formation can be realized, and lowering of image quality can be prevented. In addition, because a warp of the front surface of the first layer 121 is reduced, it becomes difficult for the surrounding member 140 to peel off the first layer 121.

Next, the heat dissipating property of the imaging unit 10 is explained. The first layer 121 has a plurality of thermal vias 129. The plurality of thermal vias 129 is formed immediately below the imaging chip 100. The plurality of thermal vias 129 formed immediately below the imaging chip 100 thermally link the interconnection 127 of the first layer 121 and the core layer 123. Thereby, heat generated in the imaging chip 100 can be transmitted to the core layer 123. Accordingly, it can be said that the plurality of thermal vias 129 functions as a heat transfer path that transmits heat generated in the imaging chip 100 to the core layer 123. The plurality of thermal vias 129 may be formed corresponding to a heat generation area of the imaging chip 100. Because the processing circuit of the circuit area 102 generates a larger amount of heat as compared with an image area, the plurality of thermal vias 129 is preferably formed immediately below the processing circuit. In particular, the plurality of thermal vias 129 is preferably formed immediately below an AD converting circuit. Also, a larger number of the thermal vias 129 may be formed immediately below the circuit area 102 as compared with an area immediately below the imaging area 101.

The first layer 121 further has a plurality of thermal vias 130. The plurality of thermal vias 130 is formed immediately below the surrounding member 140. The plurality of thermal vias 130 that is faulted immediately below the surrounding member 140 thermally links the interconnection 128 of the first layer 121 and the surrounding member 140. Thereby, heat generated in the imaging chip 100 can be transmitted to the surrounding member 140 via the core layer 123.

As illustrated in FIG. 1, the first layer 121 is a monolayer interconnection layer, and, in comparison, the second layer 122 is a multilayer interconnection layer. That is, the core layer 123 is arranged at a predetermined position that is displaced toward the side where the imaging chip 100 is mounted. Because when the first layer 121 is a multilayer interconnection layer, the thickness of the insulating layer of the first layer 121 becomes larger, the heat dissipating property deteriorates.

Because in the imaging unit 10 according to the first embodiment, the first layer 121 is a monolayer interconnection layer, the imaging chip 100 and the core layer 123 are closer as compared with a case where the first layer 121 is a multilayer interconnection layer. That is, as compared with a case where the first layer 121 is a multilayer interconnection layer, the thickness of the insulating layer 124 is smaller. Because the heat transfer path becomes shorter, the heat dissipating property is enhanced as compared with a case where the first layer 121 is a multilayer interconnection layer.

The core substrate as a whole has a quadruple-layered interconnection pattern. In order to enhance the flatness of the front surface of the first layer 121, two layers of interconnection patterns can be formed above and below the core layer 123, respectively. In this case, the interconnection patterns are formed symmetrically about the core layer 123. Because in the imaging unit 10 according to the first embodiment, the first layer 121 is formed as a monolayer in terms of a heat dissipating property, interconnection patterns are layered on the second layer as compensation. As a result, the numbers of interconnection patterns are asymmetric about the core layer.

Also, by making the core layer 123 closer to the imaging chip 100, the number of thermal vias that should be formed can be reduced. Accordingly, the configuration in which the core layer 123 is made closer to the imaging chip 100 is advantageous also in terms of the cost and the manufacturing process in addition to the heat dissipating property.

Figure 2:
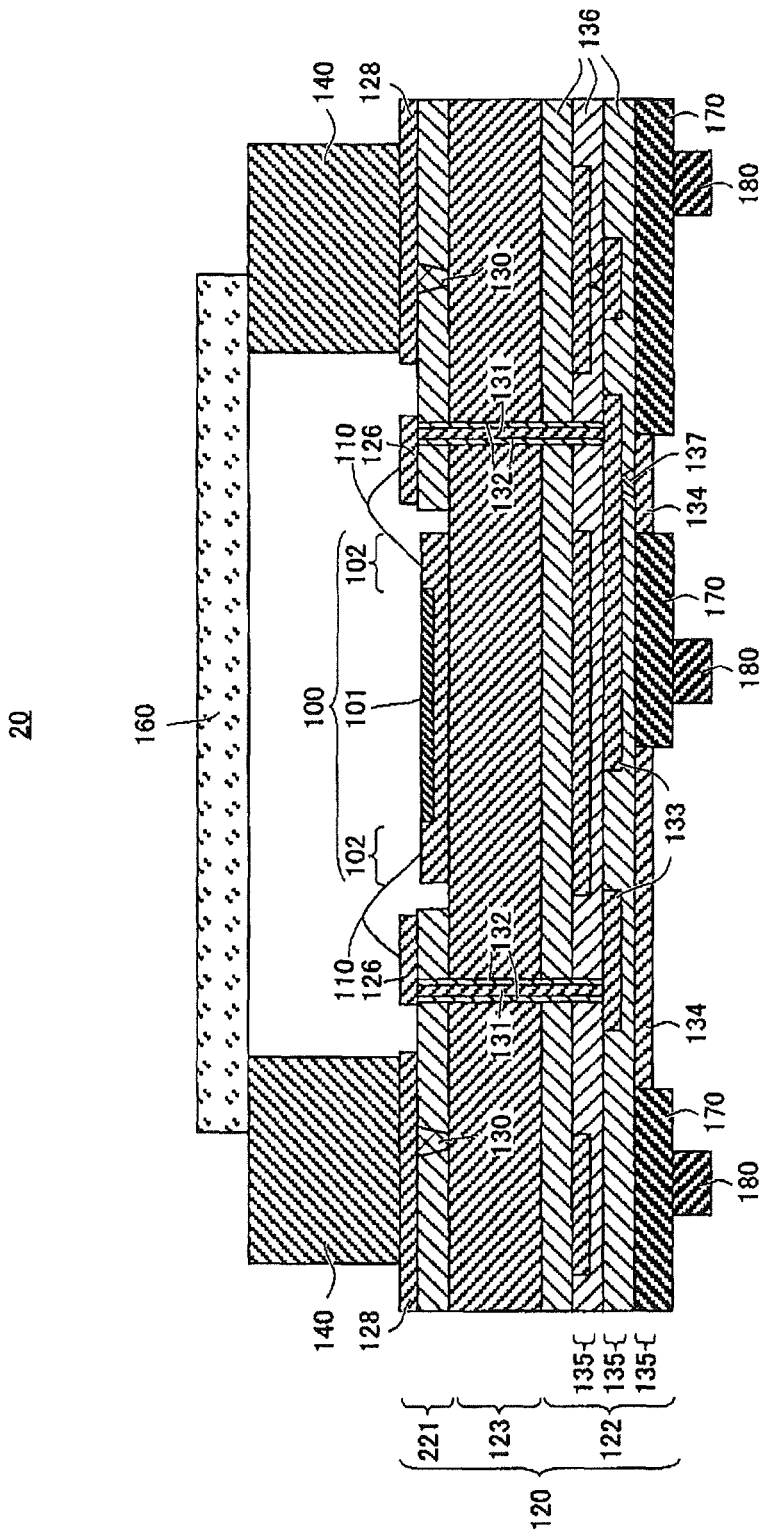
FIG. 2 is a schematic sectional view of an imaging unit.

FIG. 2 is a schematic sectional view of an imaging unit 20 according to a first variant. In FIG. 2, elements that are denoted with the same symbols as in FIG. 1 have the same functions and configurations as the elements explained in conjuncture with FIG. 1.

A first layer 221 has an opening formed at its central portion. The imaging chip 100 is directly mounted in the core layer 123 that is exposed because the opening is formed at the central portion of the first layer 221. In this case, a heat transfer path is formed as a contact surface where the imaging chip 100 is placed in contact with the core layer 123 without the first layer 221 being interposed therebetween. Because the imaging chip 100 and the core layer 123 are in direct contact, the heat dissipating property for heat generated in the imaging chip 100 can be further enhanced.

Among the above-described materials, 42Alloy may be used in particular as a material of the core layer 123. Because the linear expansion coefficient of 42Alloy and the linear expansion coefficient of the imaging chip 100 are approximately the same, a warp that attributes to a difference in the linear expansion coefficients of the core layer 123 and the imaging chip 100 can be prevented. Therefore, in addition to the heat dissipating property, the flatness of the first layer 221 can also be enhanced.

Figure 3:
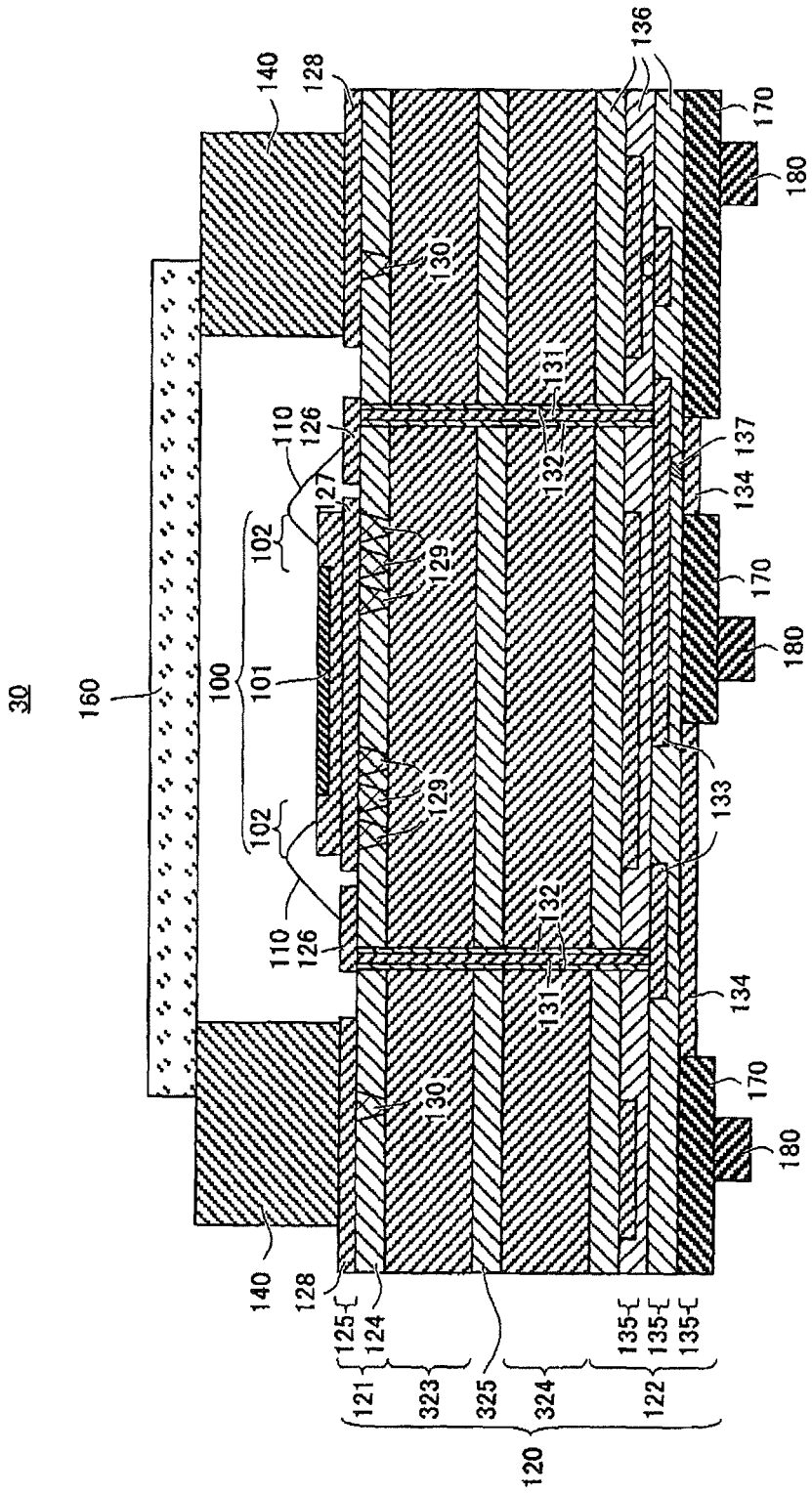
FIG. 3 is a schematic sectional view of an imaging unit.

FIG. 3 is a schematic sectional view of an imaging unit 30 according to a second variant. In FIG. 3, elements that are denoted with the same symbols as in FIG. 1 have the same functions and configurations as the elements explained in conjuncture with FIG. 1. The configuration of the imaging unit 30 is different from the configuration of the imaging unit 10 illustrated in FIG. 1 in that the imaging unit 30 has a two core layers and a heat-insulating layer sandwiched therebetween.

The core layer has a first core layer 323 arranged at a predetermined position on the imaging chip 100 side, and a second core layer 324 arranged at a predetermined position on the side opposite to the imaging chip 100 side. The first core layer 323 is utilized for dissipating heat generated in the imaging chip 100. Accordingly, the thermal conductance of the first core layer 323 is preferably higher than the thermal conductance of the second core layer 324. The thermal conductance of copper and aluminum is approximately 398 W/m·K and 236 W/m·K, respectively. Among the above-described materials of the core layer, copper, which is a material having particularly high thermal conductance, may be used as a material of the first core layer 323.

On the other hand, the second core layer 324 is used not to transmit the heated generated in the electronic parts 180 and the like to the imaging chip 100 side. Furthermore, the second core layer 324 can also block radiant heat so that radiant heat from an ASIC and the like described below is not transmitted to the imaging chip 100 when the imaging unit 30 is mounted on an imaging device. The second core layer 324 is preferably configured so that it can store as much heat generated on the side opposite to the imaging chip 100 as possible. Accordingly, the specific heat capacity of the second core layer 324 is preferably higher than the specific heat capacity of the first core layer 323. The specific heat capacity of copper and aluminum is approximately 385 J/kg·K and 900 J/kg·K, respectively. Aluminum, which is a material having particularly high specific heat capacity among the above-described materials of the core layer, may be used as a material of the second core layer 324. Note that the second core layer 324 may be formed to have a volume larger than that of the first core layer.

A heat-insulating layer 325 having thermal conductance lower than those of the first core layer 323 and the second core layer 324 is formed between the first core layer and the second core layer. Thereby, heat from one of the first core layer and the second core layer can be prevented from being transferred to the other. A fluorine-based resin or the like may be used as a material having low thermal conductance.

When materials of the first core layer 323 and the second core layer 324 are different from each other, the amounts of thermal expansion or contraction are different. In this case, a warp that attributes to the difference between the amounts of thermal expansion or contraction can be reduced by using a material having a low elastic modulus in addition to low thermal conductance as a material of the heat-insulating layer 325. For example, a material formed by impregnating a glass cloth with a thermosetting resin that is described above may be used. Note that when the first core layer 323 and the second core layer 324 are formed with common materials, the heat capacity of the second core layer 324 may be made higher by making the volume of the second core layer 324 larger than the volume of the first core layer 323. In the above-described manner, because the imaging unit 30 has a double-layered structure consisting of the first core layer 323 and the second core layer 324, heat from the imaging chip 100 and heat from the electronic parts 180 and the like can be processed separately, and radiant heat and the like from an ASIC and the like can also be blocked by the second core layer 324.

Figure 4:
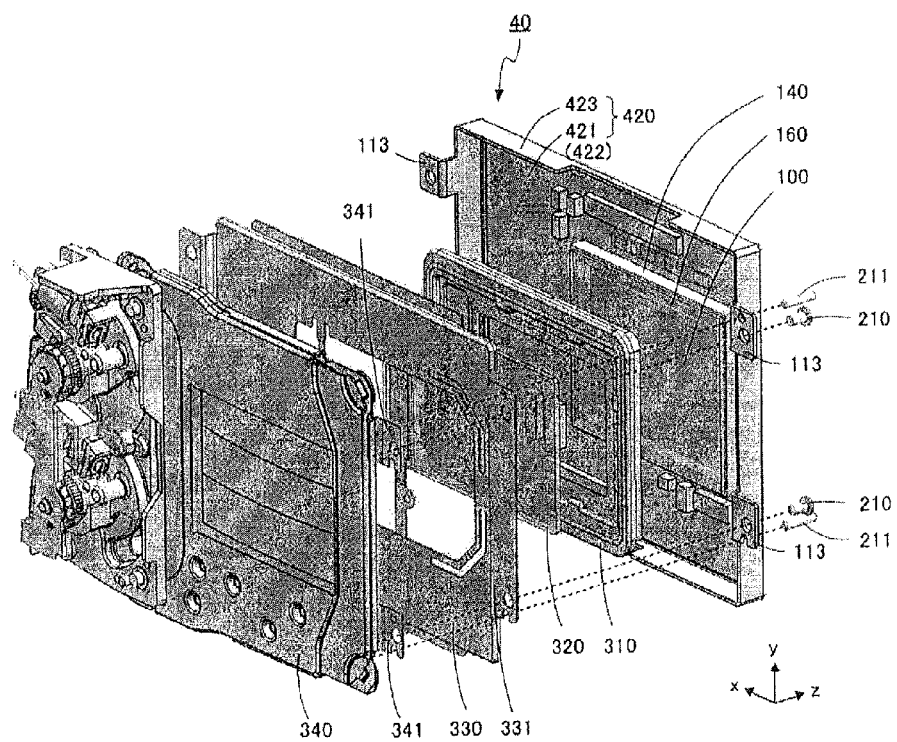
FIG. 4 is an exploded perspective view of an imaging unit having a shutter unit.

One example of attachment of the imaging units illustrated in FIGS. 1 to 3 and a structure (for example, a mirror box) is explained. Here, in particular, a case where the core layer of the core substrate and the structure are attached is explained. The imaging unit is attached to the structure, and a shutter unit is fastened with the imaging unit and the structure. FIG. 4 is an exploded perspective view of an imaging unit 40 and a shutter unit 340. The direction in which a subject luminous flux is incident on the imaging chip 100 is defined as the z-axis direction. Also, the longitudinal direction and the short direction of the imaging chip 100 are defined as the x-axis direction and the y-axis direction, respectively.

The imaging unit 40 is configured to include the imaging chip 100, a core substrate 420, the surrounding member 140, and the cover glass 160. The core substrate 420 has a configuration in which a core layer 423 is sandwiched between a first layer 421 and a second layer 422 as described above. The core layer 423 can be used also as the ground. A part of the core layer 423 is extended outward beyond the first layer 421 and the second layer 422. Specifically, the core layer 423 has a shape in which the core layer 123 extends in the examples of FIG. 1 and FIG. 2. On the other hand, in the example of FIG. 3, either of the first core layer 323 and the second core layer 324 has an extended shape. Attachment portions 113 for attachment to the shutter unit 340 are formed in the extended portion. In other words, the first layer 421 and the second layer 422 are not formed in the attachment portions 113.

The shutter unit 340 is configured with a focal plane shutter consisting of a front curtain and a rear curtain that can each be in an unfolded state and a housed state, and with a drive unit that drives the front curtain and the rear curtain. The shutter unit 340 is attached to the attachment portions 113 of the imaging unit 40 so as to sandwich, with the imaging chip 100, a mask rubber 310, an optical low pass filter 320, and a pressing plate 330. Specifically, the shutter unit 340 and the pressing plate 330 include attachment portions 341, 331, respectively, that are similar to the attachment portions 113 of the imaging unit 40. The imaging unit 40 and the shutter unit 340 are integrated by screws 210 that penetrate hole portions provided to the attachment portions 341, 331 and hole portions provided to the attachment portions 113. Also, the attachment portions 341, 331 have positioning holes and the like similar to the attachment portions 113, and the shutter unit 340 and the pressing plate 330 are also positioned accurately relative to the structure by positioning pins 211.

The focal plane shutter generates static electricity due to travel of the curtains in some cases. Static electricity not only interferes with smooth travel of the curtains, but also becomes a factor of noise components entering into an output of the imaging chip 100. To cope with this, in order to cause generated static electricity to escape to the ground, the focal plane shutter is electrically connected with the core layer 423. Specifically, the attachment portions 341 of the shutter unit 340 are formed with metal, and are connected with a link mechanism of the focal plane shutter. Then, by adopting the metal screws 210, the attachment portions 341 and the attachment portions 113 that are a part of the core layer 423 are electrically connected. In this case, the attachment portions 341 serve a function of a connection part to cause static electricity to escape. Note that the connection part may be provided to another portion of the core layer 423.

Figure 5:
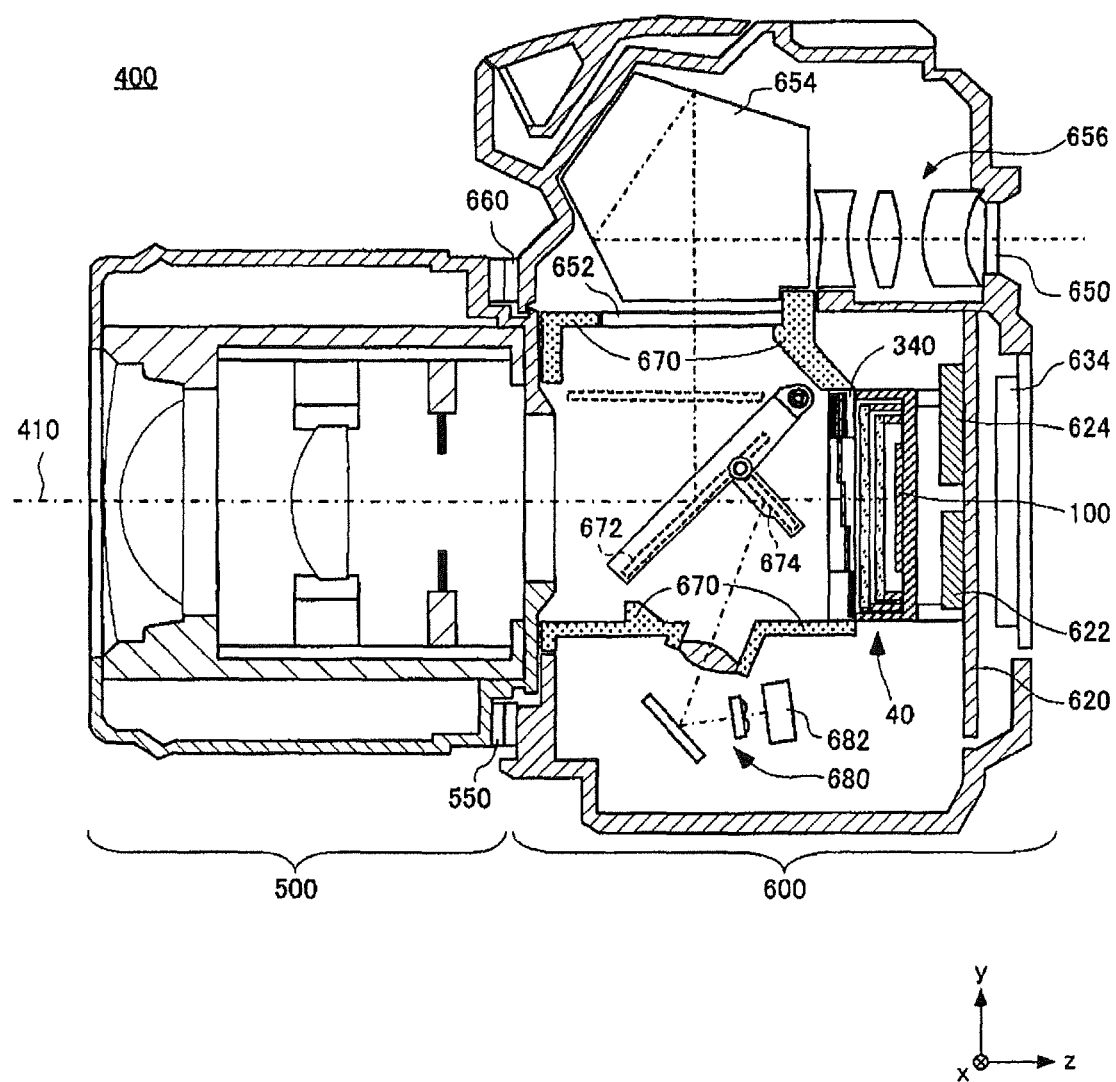
FIG. 5 is a sectional view schematically illustrating the structure of an imaging device.

FIG. 5 is a schematic sectional view of a camera 400 that is one example of an imaging device according to the first embodiment. The camera 400 includes a lens unit 500 and a camera body 600. The camera body 600 is equipped with the lens unit 500. The lens unit 500 includes, within its lens barrel, optical systems that are arrayed along an optical axis 410, and guides an incident subject luminous flux to the imaging unit 40 of the camera body 600.

The camera body 600 includes a main mirror 672 and a sub-mirror 674 behind a body mount 660 coupled with a lens mount 550. The main mirror 672 is axially supported to be revolvable between an obliquely provided position at which the main mirror 672 is provided obliquely relative to a subject luminous flux incident from the lens unit 500 and an evacuation position at which the main mirror 672 is evacuated from the subject luminous flux. The sub-mirror 674 is axially supported to be revolvable relative to the main mirror 672.

When the main mirror 672 is at the obliquely provided position, much of the subject luminous flux that is incident through the lens unit 500 is reflected on the main mirror 672 and guided to a focusing plate 652. The focusing plate 652 is disposed at a position that is conjugate with the light receiving surface of the imaging chip 100, and visualizes a subject image formed by the optical systems of the lens unit

500. The subject image formed on the focusing plate 652 is observed from a finder 650 through a pentaprism 654 and finder optical systems 656.

A part of the subject luminous flux that is incident on the main mirror 672 at the obliquely provided position is transmitted through the half-mirror area of the main mirror 672, and is incident on the sub-mirror 674. The sub-mirror 674 reflects a part of the incident luminous flux from the half-mirror area toward focusing optical systems 680. The focusing optical systems 680 guide a part of the incident light flux to a focus detection sensor 682. The focus detection sensor 682 outputs a detection result to a body-side CPU 622.

The focusing plate 652, the pentaprism 654, the main mirror 672, and the sub-mirror 674 are supported by a mirror box 670 as a structure. As described above, the mirror box 670 is attached to the imaging unit 40 via the attachment portions 113. When the main mirror 672 and the sub-mirror 674 are evacuated to the evacuation position, and the front curtain and the rear curtain of the shutter unit 340 are in the open state, the subject luminous flux that is transmitted through the lens unit 500 reaches the light receiving surface of the imaging chip 100.

A body substrate 620 and a rear surface display unit 634 are sequentially placed behind (the z-axis positive direction) the imaging unit 40. The rear surface display unit 634 for which a liquid crystal panel or the like is adopted appears on the rear surface of the camera body 600. The rear surface display unit 634 displays an image generated from an output signal from the imaging chip 100. The rear surface display unit 634 is arranged at a predetermined position on the side of the core layer 423 opposite to the imaging chip 100.

Electronic circuits such as the CPU 622 or an image processing ASIC 624 are mounted on the body substrate 620. An output signal of the imaging chip 100 is passed over, via the flexible substrate, to the image processing ASIC 624 that is a processing chip to process the output signal. The image processing ASIC 624 is arranged at a predetermined position on the side of the core layer 423 opposite to the imaging chip 100.

The electronic circuits such as the image processing ASIC 624, a TFT driver, an actuator and the like that are placed in a rear part of the imaging unit 10 may become noise generation sources. Because the core layer 423 is placed between these noise generation sources and the imaging chip 100, electromagnetic waves generated from the noise generation sources can be blocked by the core layer 423. Also, radiant heat from the electronic circuits such as the image processing ASIC 624 placed in a rear part of the imaging unit 40 can be blocked. In order to improve the properties of blocking electromagnetic waves and radiant heat, the structure of the above-described imaging unit 30 may be adopted.

A crystal low-pass filter may be used as the cover glass 160 of the imaging unit. When a crystal low-pass filter that is being divided into a plurality of pieces is placed in the camera 400, one of them may be placed in place of the cover glass 160. Although in the explanation above, the core layer 123 of the core substrate 120 is explained as being formed with metal, the core layer 123 may be formed with an insulating material such as a high-rigidity resin in terms of the flatness of the first layer. In other words, the core layer 123 may be a resin core. For example FR4 may be used as a high-rigidity insulating material.

Although it was explained above that because the elastic modulus of the insulating layer of the first layer is lower than the elastic modulus of the insulating layer of the second layer, the flatness of the surface where the imaging chip 100 is mounted can be made higher, also even when the elastic modulus of the insulating layer of the second layer is lower than the elastic modulus of the insulating layer of the first layer, the flatness of the surface where the imaging chip 100 is mounted can be made higher similarly.

Due to heat that is applied at the time of bonding between the imaging chip and the core substrate, the interconnection pattern of each layer in the second layer experiences thermal expansion or contraction. If a material having a high elastic modulus is used as a material of the insulating layer of the second layer, the insulating layer also deforms due to the thermal expansion or contraction of the interconnection pattern of each layer as described above. The stress generated in the interconnection pattern 135 of each layer is not absorbed so much by the insulating layers 136, but acts upon the first layer 121. As a result, a warp may be generated in the imaging chip itself. On the other hand, because the surrounding member is configured with a material having a high elastic modulus, the surrounding member generates stress in a direction to remain at the bonded part against the stress acting on the first layer 121. Because of this, the surrounding member may peel off the first layer.

By using a material having a low elastic modulus as the insulating layer of the second layer, stress generated due to thermal expansion or contraction of the interconnection pattern of each layer can be mitigated. In addition, when a material having a low elastic modulus is used, stress to be generated is first of all smaller as compared with a material having a high elastic modulus. Accordingly, the influence of the stress generated in the second layer on the front surface of the first layer becomes less significant. Therefore, a warp of the surface where the imaging chip is mounted can be reduced. As a result, a warp of the imaging chip can be reduced also.

Although in the explanation above, the number of interconnection patterns of the first layer and the number of interconnection patterns of the second layer are different, the number of interconnection patterns of the first layer and the number of interconnection patterns of the second layer may be the same in terms of the flatness of the first layer. In this case also, by configuring either of the insulating layers of the first layer and the second layer with a material having a low elastic modulus, the flatness of the surface where the imaging chip 100 is mounted can be made higher.

Although in the explanation above, the electronic parts are explained as being mounted on a surface, of the second layer, that is on the side opposite to the core layer, the electronic parts may be mounted inside the second layer. In this case also, because the core layer is placed between the electronic parts and the imaging chip, heat and electromagnetic waves that are generated in the electronic parts can be blocked by the core layer.

Although a configuration in which the core layer in the core substrate and the structure are attached was explained, the structure may be attached to the surrounding member. In this case, a part of the surrounding member is formed to extend outward beyond the first layer. Then, an attachment portion to be attached to the structure is formed in the extended portion. In this case, the above-mentioned metal or material formed by insert molding of metal and resin may be used as a material of the surrounding member 140. Thereby, heat can be dissipated effectively from the surrounding member 140 to the structure. Furthermore, by increasing the number of the thermal vias 130, the heat dissipating property can be enhanced.

In the imaging unit 20, the imaging chip 100 is directly mounted on the core layer 123 that is exposed by an opening being formed at a central portion of the first layer 221. Although in the explanation above, the planarity of the front surface of the core layer 123 is not particularly mentioned, because the imaging chip 100 is placed on the front surface of the core layer 123, the front surface of the core layer 123 is preferably an accurate flat surface. For this reason, a flattening process such as polishing may be performed on the core layer 123. As described above, a flattening process may be performed also when the core layer 123 is a resin core. Note that the flattening process may not be performed entirely on a portion, of the core layer 123, that corresponds to the opening of the first layer 221, but may be performed in an area where the imaging chip 100 is placed.

Figure 6:
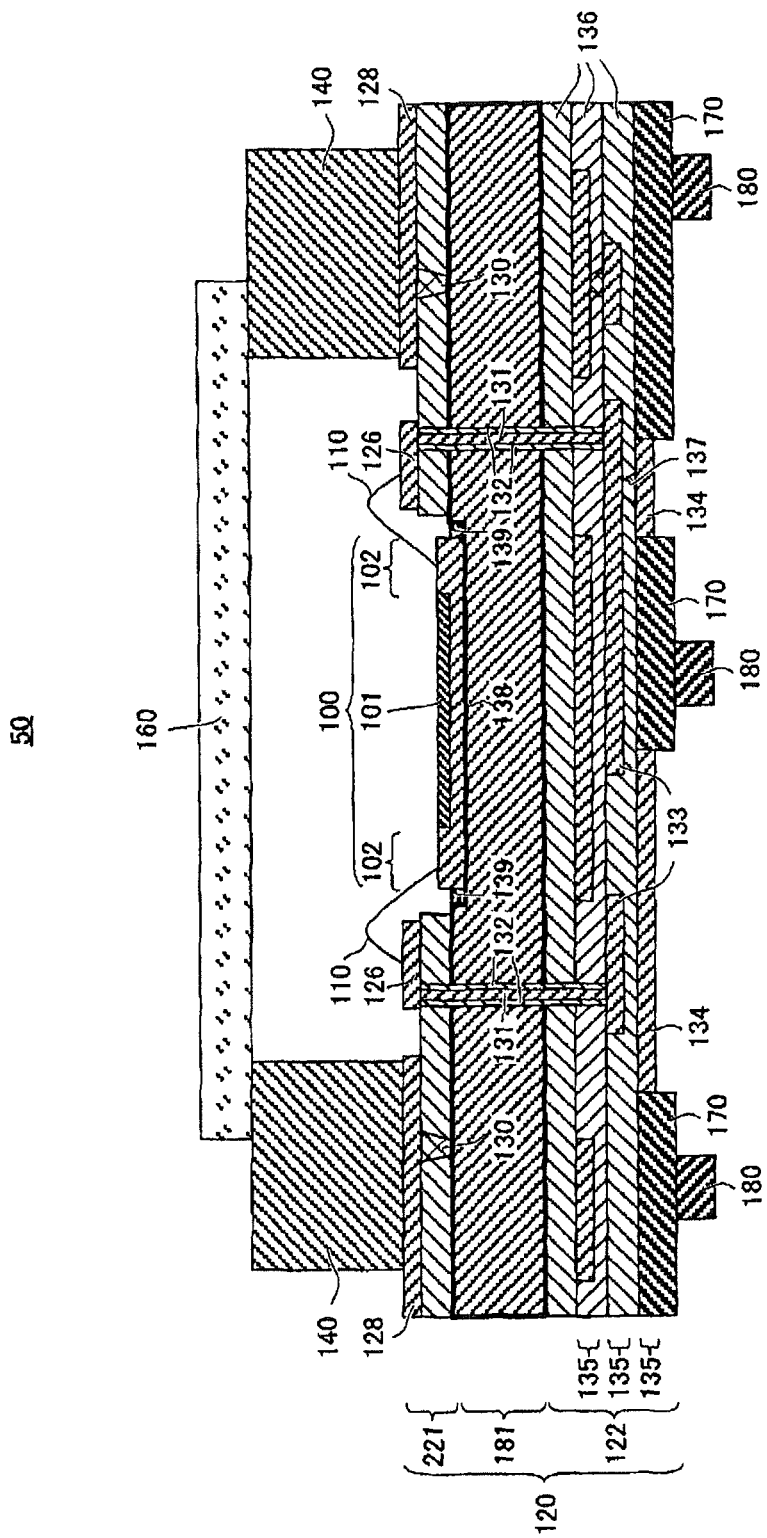
FIG. 6 is a schematic sectional view of an imaging unit.

The configuration in which the imaging chip 100 is directly mounted on the core layer 123 is not limited to the configuration of the imaging unit 20 illustrated in FIG. 2. FIG. 6 is a schematic sectional view of an imaging unit 50 according to a third variant. In FIG. 6, elements that are denoted with the same symbols as in FIG. 2 have the same functions and configurations as the elements explained in conjuncture with FIG. 2. The configuration of the imaging unit 50 is different from the configuration of the imaging unit 20 illustrated in FIG. 2 in that a core layer 181 has a concave portion 138 that houses the imaging chip 100.

The imaging chip 100 is housed in the concave portion 138 of the core layer 181. The concave portion 138 is formed for example by milling. By forming the concave portion 138 by milling, the planarity of the bottom surface of the concave portion 138 can be improved also.

In the configuration in which the imaging chip 100 is housed in the concave portion 138, a space between the side surface of the imaging chip 100 and the inner wall surface of the concave portion 138 may be filled with a resin material 139 having high thermal conductivity. Thereby, heat can be dissipated also from the side surface of the imaging chip 100 via the resin material 139 to the core layer 181.

Also, because the imaging chip 100 is housed in the concave portion 138, an interval between the imaging chip 100 and the cover glass 160 can be widened. When dust, foreign matters, and the like adhere to the cover glass 160 or the cover glass 160 has scratches, a captured image may reflect them, but by widening the interval between the imaging chip 100 and the cover glass 160, the influence of such reflection can be reduced. Also, because the imaging chip 100 is housed in the concave portion 138, the thickness of the surrounding member 140 can be made thin by a corresponding degree.

When the depth of the concave portion 138 is larger than the thickness of the imaging chip 100, the light receiving surface of the imaging chip 100 becomes lower than the opening surface of the concave portion 138. For this reason, light that is incident from an oblique direction may not reach the peripheral part of the imaging chip 100 in some cases. In this case, the inner wall of the concave portion 138 is chamfered to attain a tapered shape so that light that is incident from an oblique direction can reach the imaging chip 100. Note that the core layer 181 may have, in place of the concave portion 138, a convex portion on which a flattening process has been performed, and the imaging chip 100 may be placed at the convex portion.

Figure 7:
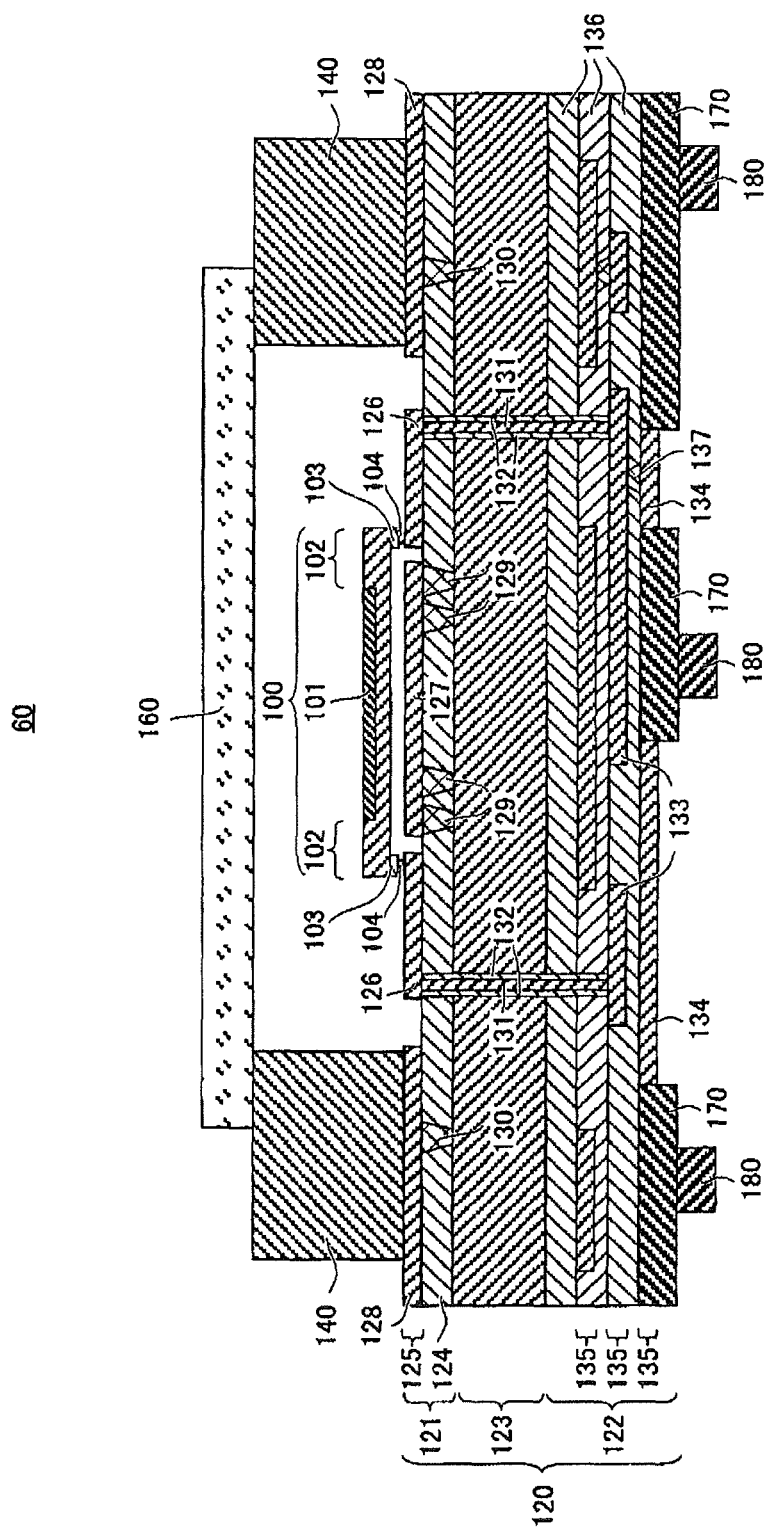
FIG. 7 is a schematic sectional view of an imaging unit.

Although the imaging chip 100 and the interconnection 126 of the first layer are assumed to be connected by the bonding wires 110, electrical connection between the imaging chip 100 and the interconnection 126 of the first layer is not limited thereto. FIG. 7 is a schematic sectional view of an imaging unit 60 according to a fourth variant. In FIG. 7, elements that are denoted with the same symbols as in FIG. 1 have the same functions and configurations as the elements explained in conjuncture with FIG. 1. The configuration of the imaging unit 60 is different from the configuration of the imaging unit 10 illustrated in FIG. 1 in that the imaging chip 100 and the interconnection 126 are bump-bonded.

In the imaging unit 60, the imaging chip 100 is preferably a backside illuminating type imaging chip. The imaging chip 100 includes electrode portions 103 on a surface that is opposite to a surface on the side where the imaging area 101 is formed. The imaging chip 100 includes an interconnection that transmits a pixel signal. The electrode portions 103 are electrically connected to the interconnection via vias. The electrode portions 103 are connected to the interconnection 126 of the first layer 121 by bumps 104. Thereby, a pixel signal output from the imaging area 101 is transmitted to the interconnection 126 via the bumps 104.

Also, even a low-rigidity layer that does not have sufficient rigidity as the core layer 123 can serve as the core layer 123 if the rigidity as a whole is made higher by forming a metal layer or a high-rigidity resin layer in the low-rigidity layer. Metal layers or high-rigidity resin layers are preferably formed on both the upper and lower surfaces of the low-rigidity layer in terms of restraining a warp of the core substrate 120. For example, copper layers may be formed as metal layers on both the upper and lower surfaces of a resin layer that is the low-rigidity layer. Also, high-rigidity resin layers may be formed on both the upper and lower surfaces of a thin-film metal layer that is the low-rigidity layer.

Second Embodiment

Figure 8:
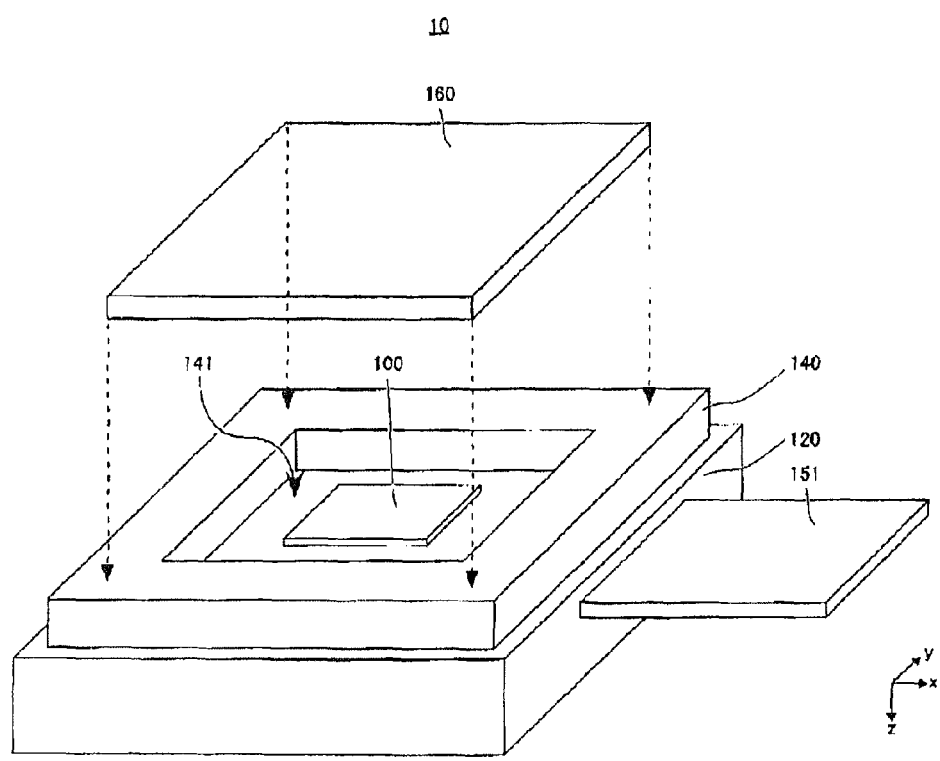
FIG. 8 is a schematic perspective view of an imaging unit.

FIG. 8 is a schematic perspective view of the imaging unit 10 according to the second embodiment. The imaging unit 10 is configured to include the imaging chip 100, the core substrate 120, the surrounding member 140, and the cover glass 160 as one example of an optical element. FIG. 8 illustrates a state where the cover glass 160 is detached for the purpose of making it easy to see the figure. The direction in which a subject luminous flux is incident on the imaging chip 100 is defined as the z-axis direction. The longitudinal direction and the short direction of the imaging chip 100 are defined as the x-axis direction and the y-axis direction, respectively. Note that the direction in which an extended portion 151 extends outward beyond one side surface (a right side surface on the sheet) of the core substrate 120 is defined as the x-axis positive direction, and the direction opposite to the x-axis positive direction is defined as the x-axis negative direction.

The imaging chip 100 is mounted on the core substrate 120. Although not illustrated here, electronic parts are mounted on a surface, of the core substrate 120, that is opposite to a surface where the imaging chip 100 is mounted. In this specification, the surface, of the core substrate 120, where the imaging chip 100 is mounted is called a chip mounting surface, and the surface where electronic parts are mounted is called parts mounting surface. The core substrate 120 has the extended portion 151 that extends in the x-axis positive direction from one side surface (a right side surface on the sheet) of the core substrate. The width of the extended portion 151 is for example approximately half of the width, in the y-axis direction, of the above-mentioned one side surface. In other words, the width of the extended portion 151 is shorter than the width of the core layer 123 described below. The extended portion 151 extends from a central portion, in the y-axis direction, on the above-mentioned side surface.

The surrounding member 140 is a rectangle as a whole, and has a rectangular aperture 141 at its central portion. In other words, the surrounding member 140 is a ring-like square. The surrounding member 140 is fixed to the core substrate 120 in a state that the imaging chip 100 is housed in the aperture 141, that is, in a state where the surrounding member 140 surrounds the imaging chip 100.

The cover glass 160 is fixed to the surrounding member 140 so as to cover the imaging chip 100. A sealed space is formed by the core substrate 120, the surrounding member 140, and the cover glass 160. Accordingly, the imaging chip 100 is placed within the sealed space. Here, if moisture and gas enter the inside of the imaging unit 10, the imaging performance of the imaging chip 100 lowers. Specifically, if moisture enters the sealed space, dew condensation occurs at the imaging chip 100 and the cover glass 160 due to the temperature difference between the inside and the outside of the sealed space. If dew condensation is generated, and mold is generated because of the dew condensation, an optical image to be formed is distorted, so the quality of an image to be output lowers. On the other hand, if gas enters the sealed space, oxidation and corrosion of circuits inside the imaging chip 100 are promoted, and destruction of the imaging chip 100 is caused. Because by placing the imaging chip 100 in the sealed space, it becomes difficult for the imaging chip 100 to be influenced by moisture and gas, lowering of the image quality can be suppressed.

Figure 9:
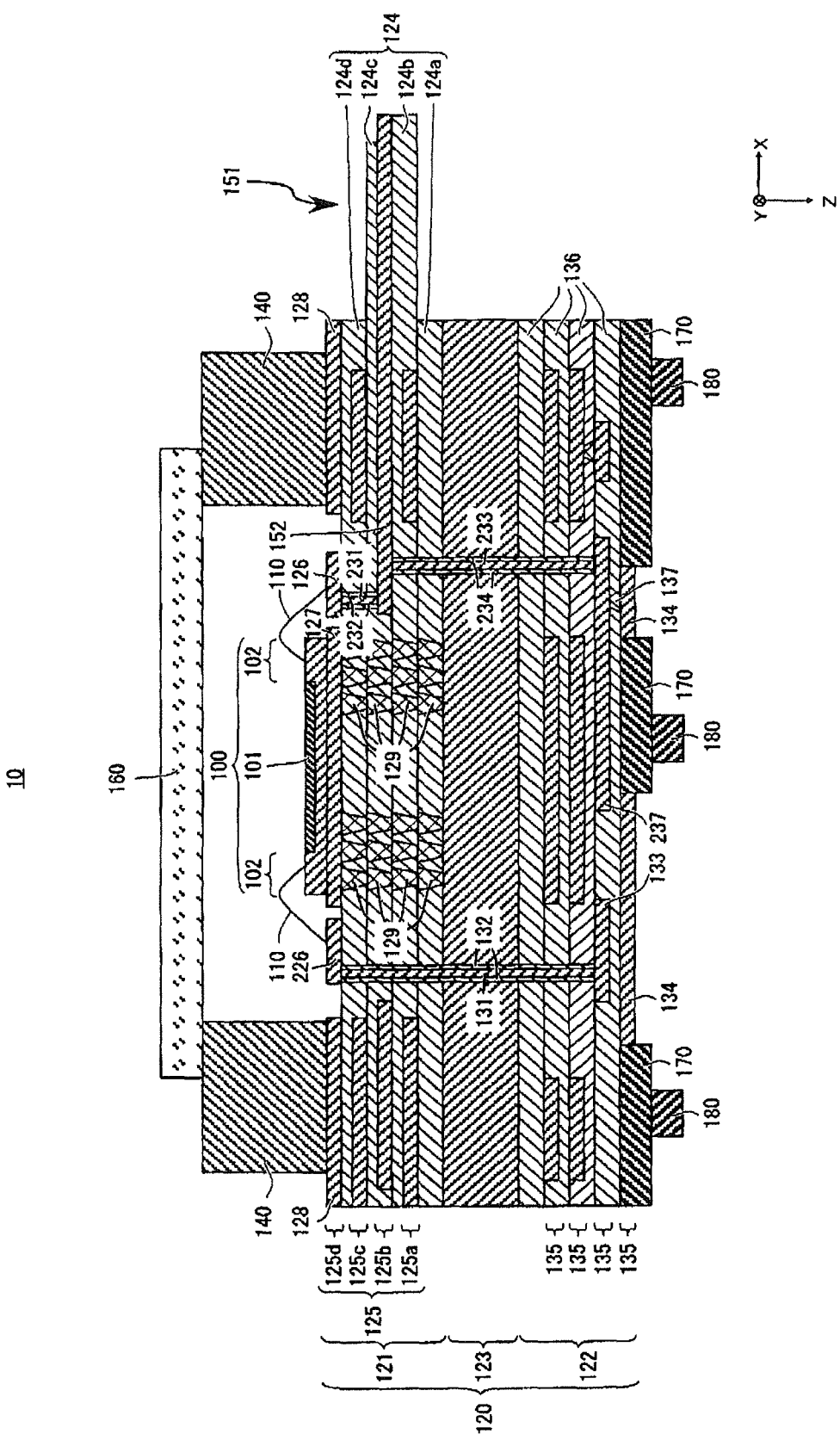

FIG. 9 is a schematic sectional view of the imaging unit 10. Specifically, FIG. 9 is a schematic sectional view of the xz plane that goes through the center of the imaging chip 100. The imaging chip 100 is configured to include the imaging area 101 and the circuit area 102. The imaging area 101 is formed at a central portion of the imaging chip 100. The imaging area 101 has a plurality of pixels that perform photoelectric conversion on a subject image that has been received. The circuit area 102 is formed in the periphery of the imaging area 101. The circuit area 102 has a processing circuit that performs signal processing of a pixel signal obtained by performing the photoelectric conversion. The processing circuit includes an AD converting circuit that converts an analog pixel signal into a digital signal.

The core substrate 120 is a metal core substrate. Specifically, the core substrate 120 is configured to include the first layer 121, the second layer 122, and the core layer 123. The thickness of the core substrate 120 as a whole is approximately 0.3 mm to 3.0 mm. The core substrate 120 has a layered structure that is symmetric about the core layer 123 in the layering direction, and this is described below in detail. In this specification, the imaging chip 100 side as seen from the core layer 123 is called the upper side of the core layer 123, and the electronic parts side as seen from the core layer 123 is called the lower side of the core layer 123 in some cases.

The first layer 121 is configured to include the insulating layer 124 and the interconnection layer 125. The interconnection layer 125 is an interconnection pattern. Both the insulating layer 124 and the interconnection layer 125 have multilayered structures. Specifically, the insulating layer 124 has a quadruple-layered structure consisting of an insulating layer 124a, an insulating layer 124b, an insulating layer 124c, and an insulating layer 124d. The interconnection layer 125 has a quadruple-layered structure consisting of an interconnection layer 125a, an interconnection layer 125b, an interconnection layer 125c, and an interconnection layer 125d. On the surface, of the core layer 123, on the imaging chip 100 side, insulating layers and interconnection layers are layered alternately in the order of the insulating layer 124a, the interconnection layer 125a, the insulating layer 124b, the interconnection layer 125b . . . . The interconnection layer 125d includes the interconnection 126, the interconnection 127, the interconnection 128, and the interconnection 226. The interconnection layer 125b includes an interconnection 152. The respective thickness of the interconnection layers 125a to 125d is approximately 10 μm to 100 μm. The imaging chip 100 is electrically connected to the interconnection 126 and the interconnection 226 by the bonding wires 110. The imaging chip 100 is mounted on the interconnection 127. The surrounding member 140 is firmly attached to the interconnection 128. The interconnection 126 and the interconnection 152 are electrically connected by a via 231. The via 231 is covered by an insulator 232. A pixel signal that is an output signal from the imaging chip 100 is transmitted to the interconnection 152 via the interconnection 126 and the via 231. The output signal transmitted to the interconnection 152 is transmitted to an external processing circuit via the extended portion 151 described below.

The core substrate 120 has the extended portion 151 that extends in the x-axis positive direction from the outer edge of the core layer 123. The extended portion 151 consists of the insulating layer 124b, the insulating layer 124c, and the interconnection layer 125b. The interconnection layer 125b extends outward beyond the outer edge of the insulating layer 124a. The interconnection layer 125b extends outward beyond the outer edges of the insulating layers 136 described below. Also, the insulating layer 124b and the insulating layer 124c are formed with flexible materials. The materials of the insulating layer 124b and the insulating layer 124c are polyimide for example. The interconnection layer 125b is formed with a flexible material. The material of the interconnection layer 125b is metal, and copper, aluminum, or the like for example. Because the insulating layer 124b, the insulating layer 124c, and the interconnection layer 125b are respectively flexible, the extended portion 151 is flexible. In order to electrically connect the extended portion 151, and a connector provided to the external processing circuit, the end portion of the extended portion 151 has an area at which the interconnection 152 is exposed. In other words, the interconnection 152 has an area that is not covered by the insulating layer 124c. Thereby, the extended portion 151 is electrically connected to the connector provided to the external processing circuit. Note that the insulating layer 124a and the insulating layer 124d may be formed with flexible materials, or may be formed with inflexible materials.

The first layer 121 has the plurality of thermal vias 129 formed in the respective one of the insulating layers 124a to 124d. The plurality of thermal vias 129 is formed immediately below the imaging chip 100. The plurality of thermal vias 129 is formed to link from the insulating layer 124a to the insulating layer 124d to thermally link the interconnection 127 of the first layer 121 and the core layer 123. Thereby, heat generated in the imaging chip 100 can be transmitted to the core layer 123. The plurality of thermal vias 129 may be formed corresponding to a heat generation area of the imaging chip 100. Because the processing circuit of the circuit area 102 generates a larger amount of heat as compared with an image area, the plurality of thermal vias 129 is preferably formed immediately below the processing circuit. In particular, the plurality of thermal vias 129 is preferably formed immediately below an AD converting circuit. Also, a larger number of the thermal vias 129 may be formed immediately below the circuit area 102 as compared with an area immediately below the imaging area 101.

The core layer 123 is a metal core. An alloy of nickel and iron (for example, 42Alloy or 56Alloy), copper, aluminum, or the like can be used as a material of the core layer 123. Here, the elastic moduluses of the alloy of nickel and iron, aluminum, and copper are approximately 150 GPa, 130 GPa, and 70 GPa, respectively. The thickness of the core layer 123 is larger than the thickness of the interconnection pattern 125 of the first layer 121 and the interconnection patterns 135 of the second layer 122 described below. Specifically, the thickness is approximately 0.1 mm to 1.0 mm. For this reason, the rigidity of the core layer 123 is higher than the rigidity of the first layer 121 and the second layer 122. The core layer 123 is distinguished from the interconnection pattern 125 of the first layer 121 and the interconnection patterns 135 of the second layer 122 in terms of the heat dissipating properties and rigidity. More specifically, the core layer 123 is distinguished from the interconnection pattern 125 and the interconnection patterns 135 in that the core layer 123 can serve a function of dissipating heat generated in the imaging chip 100, and a function of retaining other members by making use of its high rigidity.

The second layer 122 is configured to include the insulating layers 136 and the interconnection layers 135. The interconnection layers 135 are interconnection patterns. Both the insulating layers 136 and the interconnection layers 135 have multilayered structures. Specifically, both the insulating layers 136 and the interconnection layers 135 have quadruple-layered structures. On a surface, of the core layer 123, that is opposite to the imaging chip 100, the insulating layers 136 and the interconnection layers 135 are layered alternately in this order. The interconnection layers 135 include the interconnection 133, the interconnection 134 and an interconnection 237. The thickness of the interconnection layer 135 is approximately 10 μm to 100 μm. The insulating layers 136 of the second layer 122 may be formed with a flexible material, or may be formed with the other above-mentioned insulating materials. The interconnection 226 and the interconnection 133 are electrically connected by the via 131. The via 131 is covered by the insulator 132. The interconnection 152 and the interconnection 237 are electrically connected by a via 233. The via 233 is covered by an insulator 234. The interconnection 237 and the interconnection 134 are electrically connected by the via 137.

A part of a parts mounting surface of the second layer 122 is protected by the solder mask 170. Electronic parts are mounted on the parts mounting surface via the solder mask 170. The electronic parts 180 are for example a bypass capacitor, a register, a resistance, an oscillator, and the like. These electronic parts 180 configure a power supply circuit that supplies power to circuits in the imaging chip 100, or the like. The electronic parts 180 and the interconnection 134 of the second layer 122 are electrically connected by solder.

The surrounding member 140 is formed with metal such as aluminum, brass, iron, or nickel alloy. Resin can be used as the material of the surrounding member 140, and a material formed by insert molding of metal and resin can be used. By using metal or a material formed by insert molding of metal and resin as the material of the surrounding member 140, the surrounding member 140 can be used as a radiator. The cover glass 160 is formed with borosilicate glass, quartz glass, non-alkali glass, heat-resistant glass, or the like.

The imaging unit 10 according to the second embodiment is explained in comparison with an imaging unit in which a connector is mounted on a parts mounting surface of a core substrate. In the imaging unit in which a connector is mounted on a parts mounting surface of a core substrate, an interconnection has to be formed from a chip mounting surface up to the parts mounting surface where the connector is mounted in order to take out an output signal by the connector. On the other hand, in the imaging unit 10 according to the second embodiment, a part of an inner layer of the core substrate 120 is extended to take out an output signal. Because an interconnection does not have to be formed up to the parts mounting surface, an output signal can be taken out by an interconnection that is shorter that used in the imaging unit in which a connector is mounted. Accordingly, degradation of an output signal can be reduced. In particular, because the extended portion 151 is formed above the core layer 123, it is more advantageous in that degradation of an output signal can be reduced as compared with a case where the extended portion 151 is formed below the core layer 123. The interconnection layer 125d that is the closest to the imaging chip 100 may be used as an extended layer when more emphasis is placed on reduction of degradation of an output signal, and this is described below in detail. In this case, degradation of an output signal can be reduced further because the length of the interconnection to transmit an output signal becomes shorter.

In the imaging unit in which a connector is mounted on a parts mounting surface of a core substrate, contact resistance is generated between contact surfaces of the connector and the core substrate. An output signal may be degraded due to the contact resistance. In addition, the contact resistance may become a cause of contact failures of a wiring harness. On the other hand, because a connector is not used first of all in the imaging unit 10 according to the second embodiment, contact resistance that attributes to a connector is not generated. Accordingly, degradation of an output signal due to contact resistance that attributes to a connector does not occur, and contact failures are not caused due to contact resistance that attributes to a connector.

As described above, electronic parts are mounted on the parts mounting surface of the core substrate 120. In the imaging unit in which a connector is mounted on a parts mounting surface of a core substrate, the connector makes insufficient the area for mounting electronic parts. The number of pins of a connector tends to increase for the purpose of reading out output signals from an imaging chip at high speed. That is, in the future, the sizes of connectors are expected to be larger. If the sizes of connectors become larger, the problem of an insufficient area for mounting electronic parts becomes more significant. On the other hand, because a connector is not used in the imaging unit 10 according to the second embodiment, such a problem of an insufficient area for mounting the electronic parts 180 is not caused.

In the imaging unit in which a connector is mounted on a parts mounting surface of a core substrate, a connecting member via a connector such as wiring harness is used for connection with an external processing circuit. On the other hand, in the imaging unit 10 according to the second embodiment, the extended portion 151 for connection to an external processing circuit is formed by extending a part of an inner layer of the core substrate 120. Because a connecting member via a connector does not have to be used, parts cost can be reduced. In addition, because one end of the extended portion 151 is extended from the core substrate 120, a connect step is not necessary for the one end of the extended portion 151. Accordingly, it is advantageous also in terms of an assembling step.

Also, in the imaging unit 10 according to the second embodiment, the insulating layers 124b, 124c are formed with flexible materials. Accordingly, even when the interconnection layer 135 of each layer in the second layer 122 thermally expands or contracts due to heat applied at the time of bonding of the imaging chip 100 and the core substrate 120, stress generated in the second layer 122 and stress generated in the surrounding member 140 can be absorbed. Therefore, a warp of the chip mounting surface can be reduced. Thereby, because a warp of the imaging chip 100 itself can be reduced, a favorable image formation can be realized, and lowering of image quality can be suppressed. In addition, because a warp of the front surface of the first layer 121 can be reduced, it becomes difficult for the surrounding member 140 to peel off the first layer 121.

Figure 10:
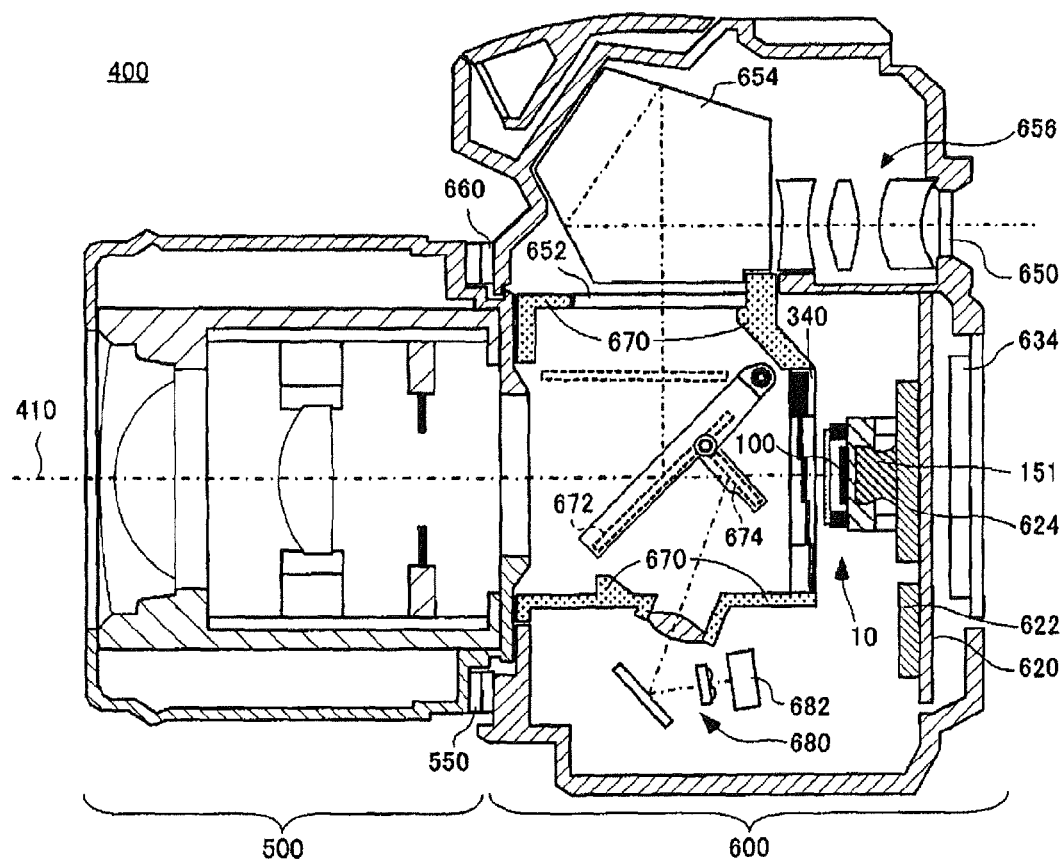
FIG. 10 is a sectional view schematically illustrating the structure of an imaging device.
Figure 10:
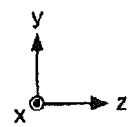

FIG. 10 is a schematic sectional view of a camera 400 that is one example of an imaging device according to the second embodiment. The camera 400 includes the lens unit 500 and the camera body 600. The lens unit 500 is mounted on the camera body 600. The lens unit 500 includes, within its lens barrel, optical systems that are arrayed along the optical axis 410, and guides an incident subject luminous flux to the imaging unit 10 of the camera body 600.

The camera body 600 includes the main mirror 672 and the sub-mirror 674 behind the body mount 660 coupled with the lens mount 550. The main mirror 672 is axially supported to be revolvable between an obliquely provided position at which the main mirror 672 is provided obliquely relative to a subject luminous flux incident from the lens unit 500 and an evacuation position at which the main mirror 672 is evacuated from the subject luminous flux. The sub-mirror 674 is axially supported to be revolvable relative to the main mirror 672.

When the main mirror 672 is at the obliquely provided position, much of the subject luminous flux that is incident through the lens unit 500 is reflected on the main mirror 672 and guided to the focusing plate 652. The focusing plate 652 is disposed at a position that is conjugate with the light receiving surface of the imaging chip 100, and visualizes a subject image formed by the optical systems of the lens unit 500. The subject image formed on the focusing plate 652 is observed from the finder 650 through the pentaprism 654 and the finder optical systems 656.

A part of the subject luminous flux that is incident on the main mirror 672 at the obliquely provided position is transmitted through the half-mirror area of the main mirror 672, and is incident on the sub-mirror 674. The sub-mirror 674 reflects a part of the incident luminous flux from the half-mirror area toward the focusing optical systems 680. The focusing optical systems 680 guide a part of the incident light flux to the focus detection sensor 682. The focus detection sensor 682 outputs a detection result to the body-side CPU 622.

The focusing plate 652, the pentaprism 654, the main mirror 672, and the sub-mirror 674 are supported by the mirror box 670 as a structure. When the main mirror 672 and the sub-mirror 674 are evacuated to the evacuation position, and the front curtain and the rear curtain of the shutter unit 340 are in the open state, the subject luminous flux that is transmitted through the lens unit 500 reaches the light receiving surface of the imaging chip 100.

The body substrate 620 and the rear surface display unit 634 are sequentially placed behind (the z-axis positive direction) the imaging unit 10. The rear surface display unit 634 for which a liquid crystal panel or the like is adopted appears on the rear surface of the camera body 600. The rear surface display unit 634 displays an image generated from an output signal from the imaging chip 100. Electronic circuits such as the CPU 622 or the image processing ASIC 624 are mounted on the body substrate 620.

The image processing ASIC 624 is placed in the lateral direction (x-axis direction) of the imaging unit 10. The extended portion 151 extends in the x-axis positive direction. The extended portion 151 is connected to a connector of the image processing ASIC 624 that is a processing chip to process an output signal. The extended portion 151 is flexible as described above. Accordingly, the extended portion 151 can be connected to the image processing ASIC 624 even if installation surfaces of the extended portion 151 and the image processing ASIC 624 are not the same. An output signal of the imaging chip 100 is passed over to the image processing ASIC 624 via the extended portion 151. Note that when the image processing ASIC 624 is placed behind the imaging unit 10, the extended portion 151 may extend semicircularly and connected to the image processing ASIC 624.

A TFT driver, an actuator and the like that are placed in a rear part of the imaging unit 10 may become noise generation sources. Because the core layer 123 is placed between these noise generation sources and the imaging chip 100, electromagnetic waves generated from the noise generation sources can be blocked by the core layer 123.

Figure 11:
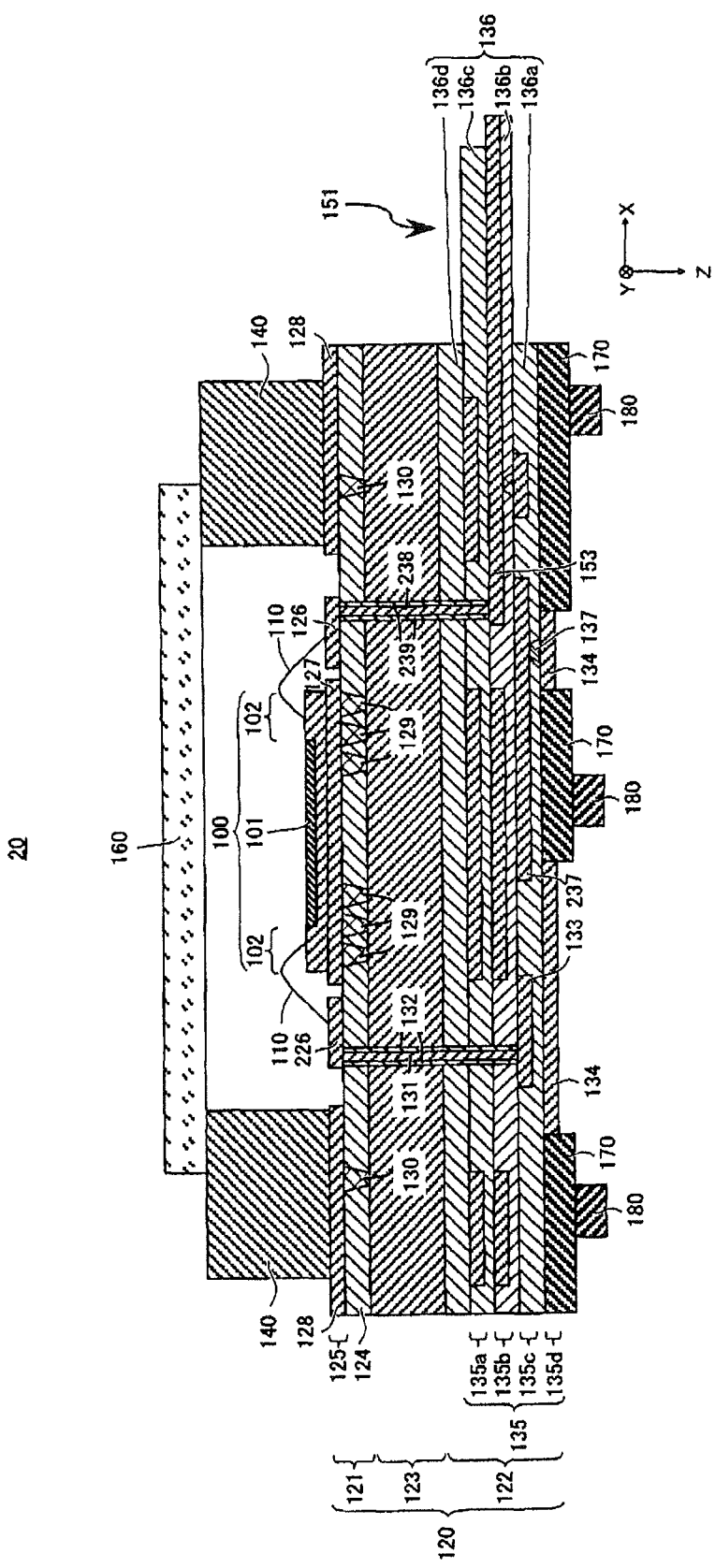
FIG. 11 is a schematic sectional view of an imaging unit.

FIG. 11 is a schematic sectional view of the imaging unit 20 according to a first variant. In FIG. 11, elements that are denoted with the same symbols as in FIG. 9 have the same functions and configurations as the elements explained in conjuncture with FIG. 9.

The core substrate 120 of the imaging unit 20 has a layered structure that is asymmetric in the layering direction about the center of the core layer 123. In other words, in the second layer 122, the insulating layers 136 and the interconnection layers 135 respectively have a quadruple-layered structure, and in the first layer 121, the insulating layer 124 and the interconnection layer 125 respectively have a mono-layered structure. Because the insulating layer 124 is a monolayer, the imaging chip 100 and the core layer 123 are closer as compared with a case where the insulating layer 124 is a multilayer. That is, the thickness of the insulating layer 124 as a whole is smaller. Then, because the heat transfer path becomes shorter, the heat dissipating property is enhanced as compared with a case where the insulating layer 124 is a multilayer.

Also, by making the core layer 123 closer to the imaging chip 100, the number of thermal vias that should be formed can be reduced. Accordingly, the configuration in which the core layer 123 is made closer to the imaging chip 100 is advantageous also in terms of the cost and the manufacturing process in addition to the heat dissipating property.

The extended portion 151 is formed below the core layer 123 in the imaging unit 20. The insulating layer 136 has a quadruple-layered structure consisting of an insulating layer 136a, an insulating layer 136b, an insulating layer 136c, and an insulating layer 136d. The interconnection layer 135 has a quadruple-layered structure consisting of an interconnection layer 135a, an interconnection layer 135b, an interconnection layer 135c, and an interconnection layer 135d. The interconnection layer 135b includes an interconnection 153. The interconnection 126 and the interconnection 153 are electrically connected by vias 238. The via 238 is covered by an insulator 239. Here, the insulating layer 136b, the insulating layer 136c, and the interconnection layer 135b that is sandwiched by the two layers are extended layers. The extended portion 151 that is an extended portion of these three layers is flexible as described above.

The extended portion 151 is formed below the core layer 123 in the imaging unit 20 according to the first variant. Also, a power supply circuit is placed on a parts mounting surface as described above. By forming the extended portion 151 below the core layer 123, the distance of an interconnection from the power supply circuit can, be shortened. Accordingly, the output impedance of the power supply can be reduced. The interconnection layer 135d that is the closest to the power supply circuit may be used as an extended layer when more emphasis is placed on reduction of the output impedance of the power supply. In this case, the output impedance of the power supply can be reduced further because the length of the interconnection to supply power becomes shorter. Also, in the imaging unit 20 according to the first variant, the length of an interconnection to transmit an output signal can be made shorter as compared with an imaging unit in which a connector is mounted on a parts mounting surface of a core substrate. Accordingly, degradation of an output signal can also be reduced.

The first layer 121 further has the plurality of thermal vias 130. The plurality of thermal vias 130 is formed immediately below the surrounding member 140. The plurality of thermal vias 130 that is formed immediately below the surrounding member 140 thermally links the interconnection 128 of the first layer 121 and the surrounding member 140. Thereby, heat generated in the imaging chip 100 can be transmitted to the surrounding member 140 via the core layer 123.

Figure 12:
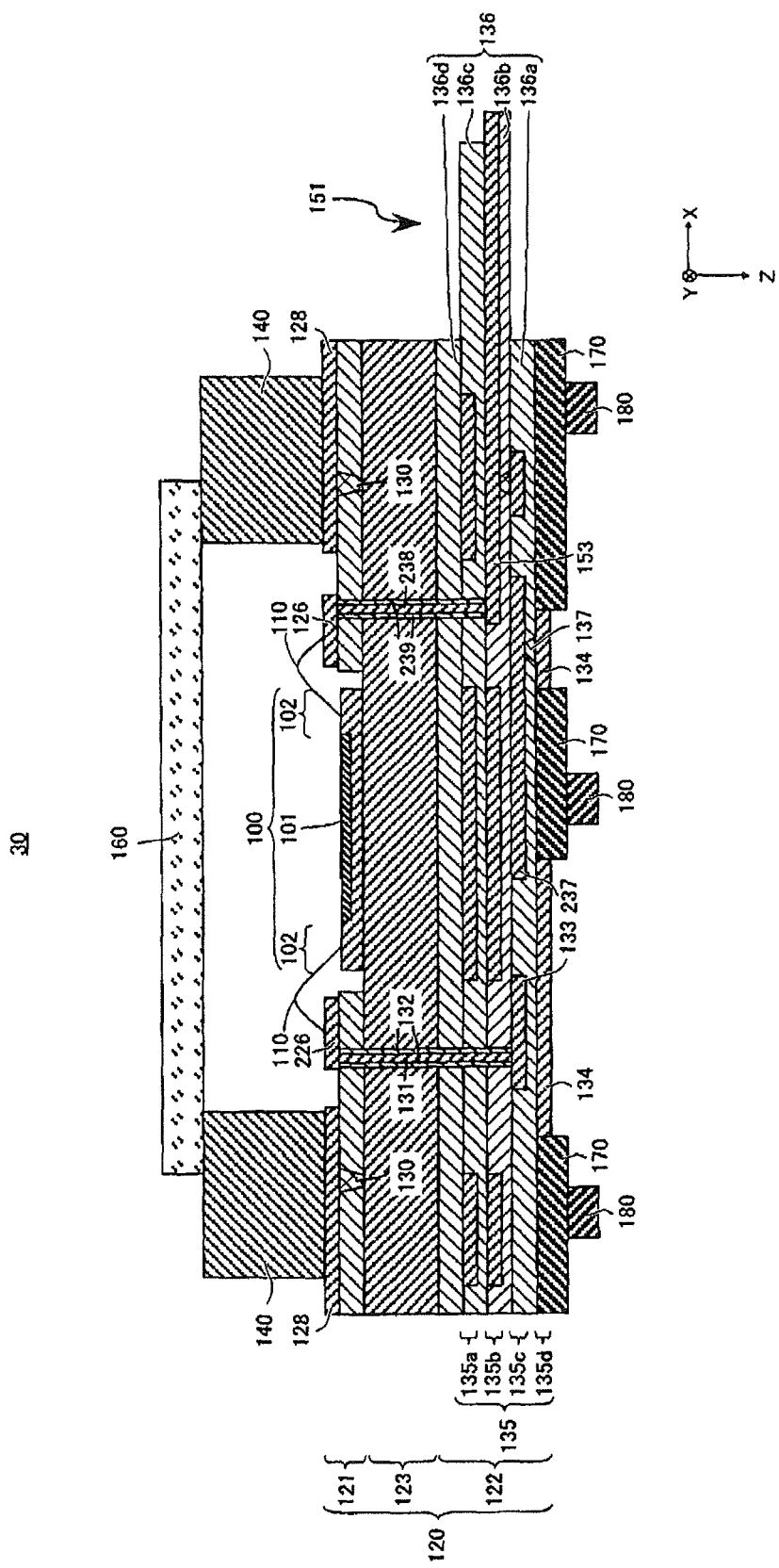
FIG. 12 is a schematic sectional view of an imaging unit.

FIG. 12 is a schematic sectional view of the imaging unit 30 according to a second variant. In FIG. 12, elements that are denoted with the same symbols as in FIG. 9 have the same functions and configurations as the elements explained in conjuncture with FIG. 9.

The first layer 121 of the imaging unit 30 has an opening formed at its central portion. The imaging chip 100 is directly mounted in the core layer 123 that is exposed because the opening is formed at the central portion of the first layer 121. In this case, a heat transfer path is formed as a contact surface where the imaging chip 100 is placed in contact with the core layer 123 without the first layer 121 being interposed therebetween. Because the imaging chip 100 and the core layer 123 are in direct contact, the heat dissipating property for heat generated in the imaging chip 100 can be further enhanced.

Among the above-described materials, 42Alloy may be used in particular as a material of the core layer 123. Because the linear expansion coefficient of 42Alloy and the linear expansion coefficient of the imaging chip 100 are approximately the same, a warp that attributes to the difference between the linear expansion coefficients of the core layer 123 and the imaging chip 100 can be suppressed. Therefore, in addition to the heat dissipating property, the flatness of the first layer 121 can also be enhanced. In order to further enhance the heat dissipating property, metal having high thermal conductance such as copper may be used as a material of the core layer 123.

Figure 13:
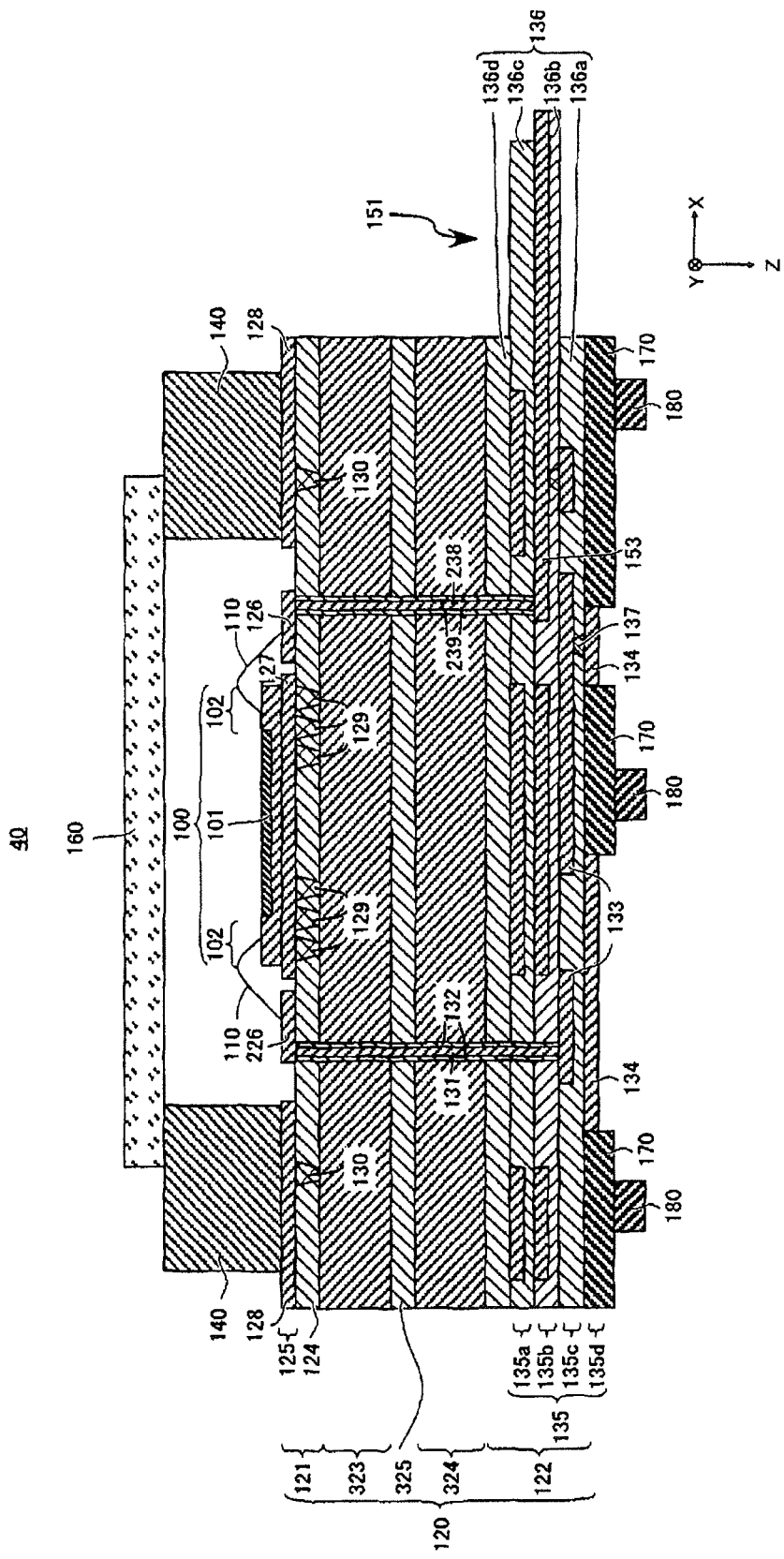
FIG. 13 is a schematic sectional view of an imaging unit.

FIG. 13 is a schematic sectional view of the imaging unit 40 according to a third variant. In FIG. 13, elements that are denoted with the same symbols as in FIG. 9 have the same functions and configurations as the elements explained in conjuncture with FIG. 9. The configuration of the imaging unit 40 is different from the configuration of the imaging unit 10 illustrated in FIG. 9 in that the imaging unit 40 has two core layers and a heat-insulating layer sandwiched therebetween.

The core layer has the first core layer 323 arranged at a predetermined position on the imaging chip 100 side, and the second core layer 324 arranged at a predetermined position on the side opposite to the imaging chip 100 side. The first core layer 323 is utilized for dissipating heat generated in the imaging chip 100. Accordingly, the thermal conductance of the first core layer 323 is preferably higher than the thermal conductance of the second core layer 324. The thermal conductance of copper and aluminum is approximately 398 W/m·K and 236 W/m·K, respectively. Among the above-described materials of the core layer, copper, which is a material having particularly high thermal conductance, may be used as a material of the first core layer 323.

On the other hand, the second core layer 324 is used for the purpose of suppressing transmission of heat generated in the electronic parts 180 or the like to the imaging chip 100 side. The second core layer 324 is preferably configured so that it can store as much heat generated on the side opposite to the imaging chip 100 as possible. Accordingly, the specific heat capacity of the second core layer 324 is preferably higher than the specific heat capacity of the first core layer 323. The specific heat capacity of copper and aluminum is approximately 385 J/kg·K and 900 J/kg·K, respectively. Aluminum, which is a material having particularly high specific heat capacity among the above-described materials of the core layer, may be used as a material of the second core layer 324. Note that the second core layer 324 may be formed to have a volume larger than that of the first core layer.

The heat-insulating layer 325 having thermal conductance lower than that of the first core layer 323 and the second core layer 324 is formed between the first core layer 323 and the second core layer 324. Thereby, transmission of heat from one of the first core layer 323 and the second core layer 324 to the other can be suppressed. A fluorine-based resin or the like may be used as a material having low thermal conductance.

When materials of the first core layer 323 and the second core layer 324 are different from each other, the amounts of thermal expansion or contraction are different. In this case, a warp that attributes to the difference between the amounts of thermal expansion or contraction can be reduced by using a material having a low elastic modulus in addition to low thermal conductance as a material of the heat-insulating layer 325. For example, a material formed by impregnating a glass cloth with a thermosetting resin that is described above may be used. Note that when the first core layer 323 and the second core layer 324 are fainted with common materials, the heat capacity of the second core layer 324 may be made higher by making the volume of the second core layer 324 larger than the volume of the first core layer 323. In the above-described manner, because the imaging unit 40 has a double-layered structure consisting of the first core layer 323 and the second core layer 324, heat generated in the imaging chip 100 and heat generated in the electronic parts 180 and the like can be processed separately. Furthermore, the influence of heat generated in the electronic parts 180 and the like is not exerted on the imaging chip 100 side, and the influence of heat generated in the imaging chip 100 is not exerted on the electronic parts 180 side.

Figure 14:
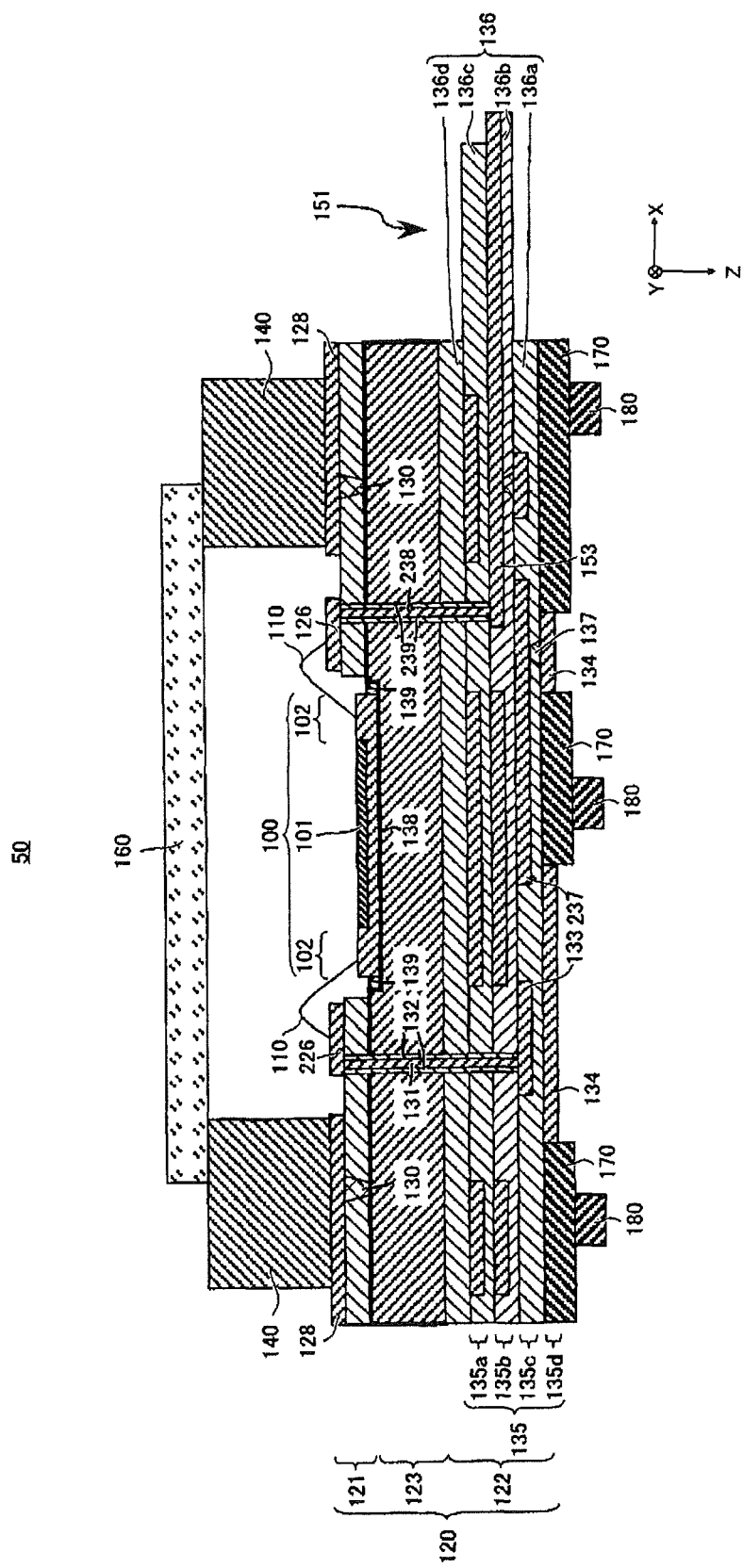
FIG. 14 is a schematic sectional view of an imaging unit.

FIG. 14 is a schematic sectional view of the imaging unit 50 according to a fourth variant. In FIG. 14, elements that are denoted with the same symbols as in FIG. 9 have the same functions and configurations as the elements explained in conjuncture with FIG. 9. The configuration of the imaging unit 50 is different from the configuration of the imaging unit 10 illustrated in FIG. 9 in that the core layer 123 has the concave portion 138 that houses the imaging chip 100.

The imaging chip 100 is housed in the concave portion 138 of the core layer 123. The concave portion 138 is formed for example by milling. By forming the concave portion 138 in this manner, the planarity of the bottom surface of the concave portion 138 can be improved also.

In the configuration in which the imaging chip 100 is housed in the concave portion 138, a space between the side surface of the imaging chip 100 and the inner wall surface of the concave portion 138 may be filled with the resin material 139 having high thermal conductivity. Thereby, heat can be dissipated also from the side surface of the imaging chip 100 via the resin material 139 to the core layer 123.

Also, because the imaging chip 100 is housed in the concave portion 138, an interval between the imaging chip 100 and the cover glass 160 can be widened. When dust, foreign matters, and the like adhere to the cover glass 160 or the cover glass 160 has scratches, a captured image may reflect them, but by widening the interval between the imaging chip 100 and the cover glass 160, the influence of such reflection can be reduced. Also, because the imaging chip 100 is housed in the concave portion 138, the thickness of the surrounding member 140 can be made thin by a corresponding degree.

When the depth of the concave portion 138 is larger than the thickness of the imaging chip 100, the light receiving surface of the imaging chip 100 becomes lower than the opening surface of the concave portion 138. For this reason, light that is incident from an oblique direction may not reach the peripheral part of the imaging chip 100 in some cases. In this case, the inner wall of the concave portion 138 may be chamfered to attain a tapered shape so that light that is incident from an oblique direction can reach the imaging chip 100. Note that the core layer 123 may have, in place of the concave portion 138, a convex portion on which a flattening process has been performed, and the imaging chip 100 may be placed at the convex portion.

Figure 15:
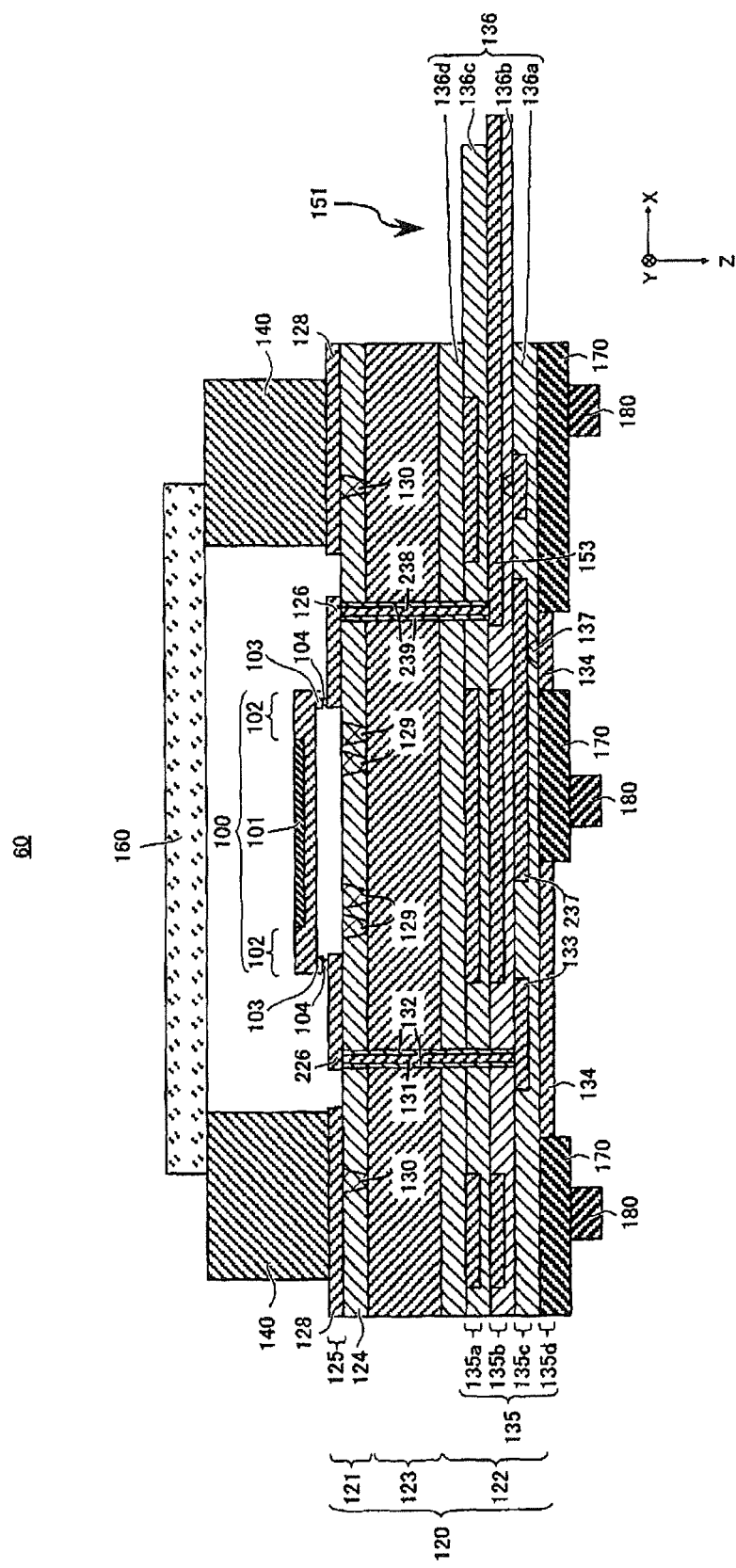
FIG. 15 is a schematic sectional view of an imaging unit.

Although in the explanation above, a configuration in which the imaging chip 100, and the interconnection 126 and the interconnection 226 of the first layer are connected by the bonding wires 110 was adopted, the electrical connection between the imaging chip 100, and the interconnection 126 and the interconnection 226 of the first layer is not limited to the configuration that uses the bonding wires 110. FIG. 15 is a schematic sectional view of the imaging unit 60 according to a fifth variant. In FIG. 15, elements that are denoted with the same symbols as in FIG. 9 have the same functions and configurations as the elements explained in conjuncture with FIG. 9. The configuration of the imaging unit 60 is different from the configuration of the imaging unit 10 illustrated in FIG. 9 in that the imaging chip 100, and the interconnection 126 and the interconnection 226 are bump-bonded.

The imaging chip 100 of the imaging unit 60 is preferably a backside illuminating type imaging chip. The imaging chip 100 includes the electrode portions 103 on a surface that is opposite to a surface on the side where the imaging area 101 is formed. The imaging chip 100 includes interconnections that transmit a pixel signal. The electrode portions 103 are electrically connected to the interconnections via vias. The electrode portions 103 are connected to the interconnection 126 and the interconnection 226 of the first layer 121 by the bumps 104.

Figure 16:
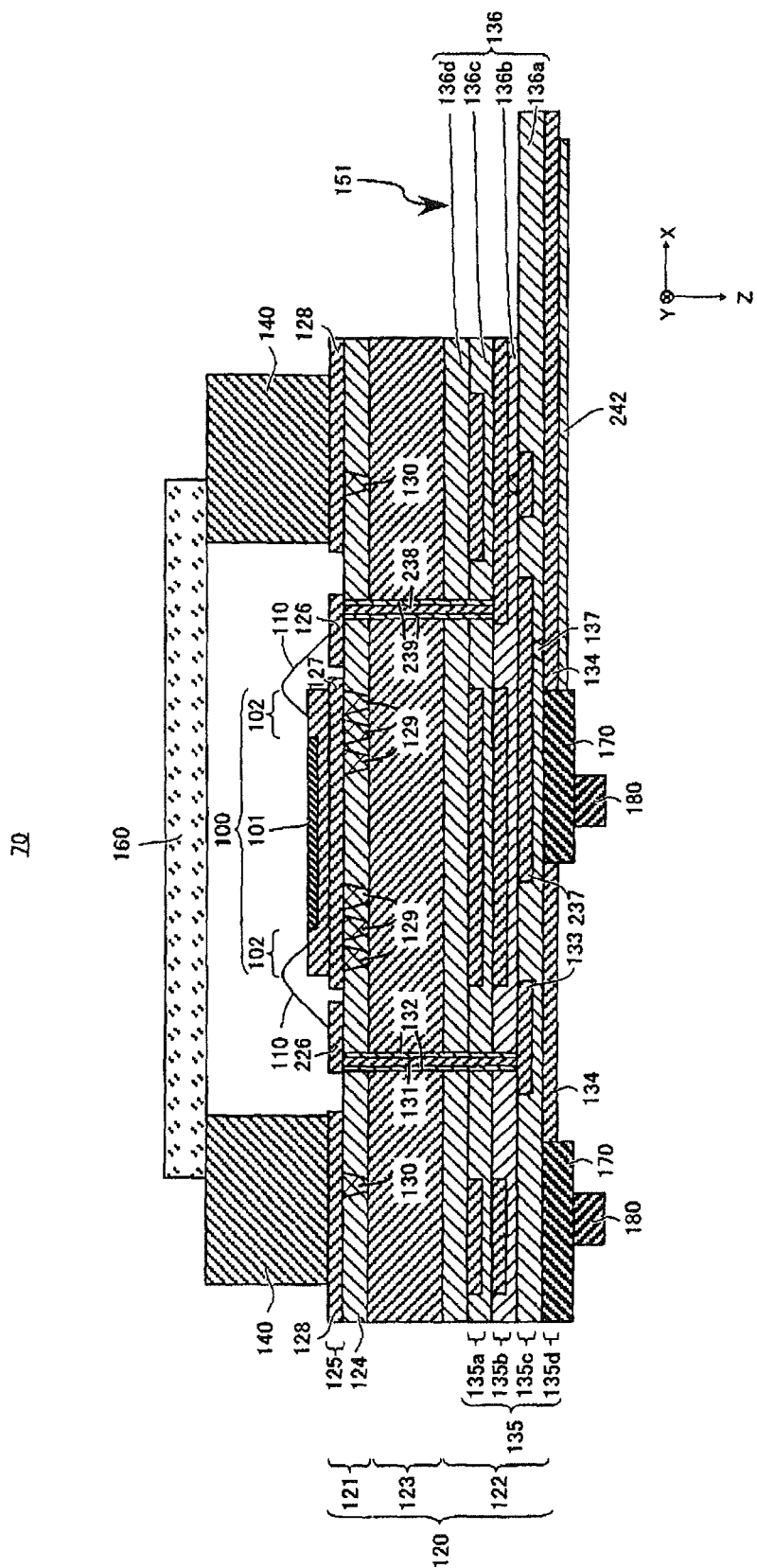
FIG. 16 is a schematic sectional view of an imaging unit.

Although in the explanation above, a triple-layered structure in which an interconnection layer is sandwiched by upper and lower insulating layers was adopted as a structure of the extended layer, the structure of the extended layer is not limited to the triple-layered structure. The extended layer may have a double-layered structure consisting of an interconnection layer and an insulating layer. FIG. 16 is a schematic sectional view of an imaging unit 70 according to a sixth variant. In FIG. 16, elements that are denoted with the same symbols as in FIG. 9 have the same functions and configurations as the elements explained in conjuncture with FIG. 9. The configuration of the imaging unit 70 is different from the configuration of the imaging unit 10 illustrated in FIG. 9 in that two layers that are the insulating layer 136a and the interconnection layer 135d are extended. In this case, a part of a surface, of the interconnection 134 in the interconnection layer 135d, that is on the side not covered with the insulating layer 136a may be coated with an insulator 242.

Figure 17:
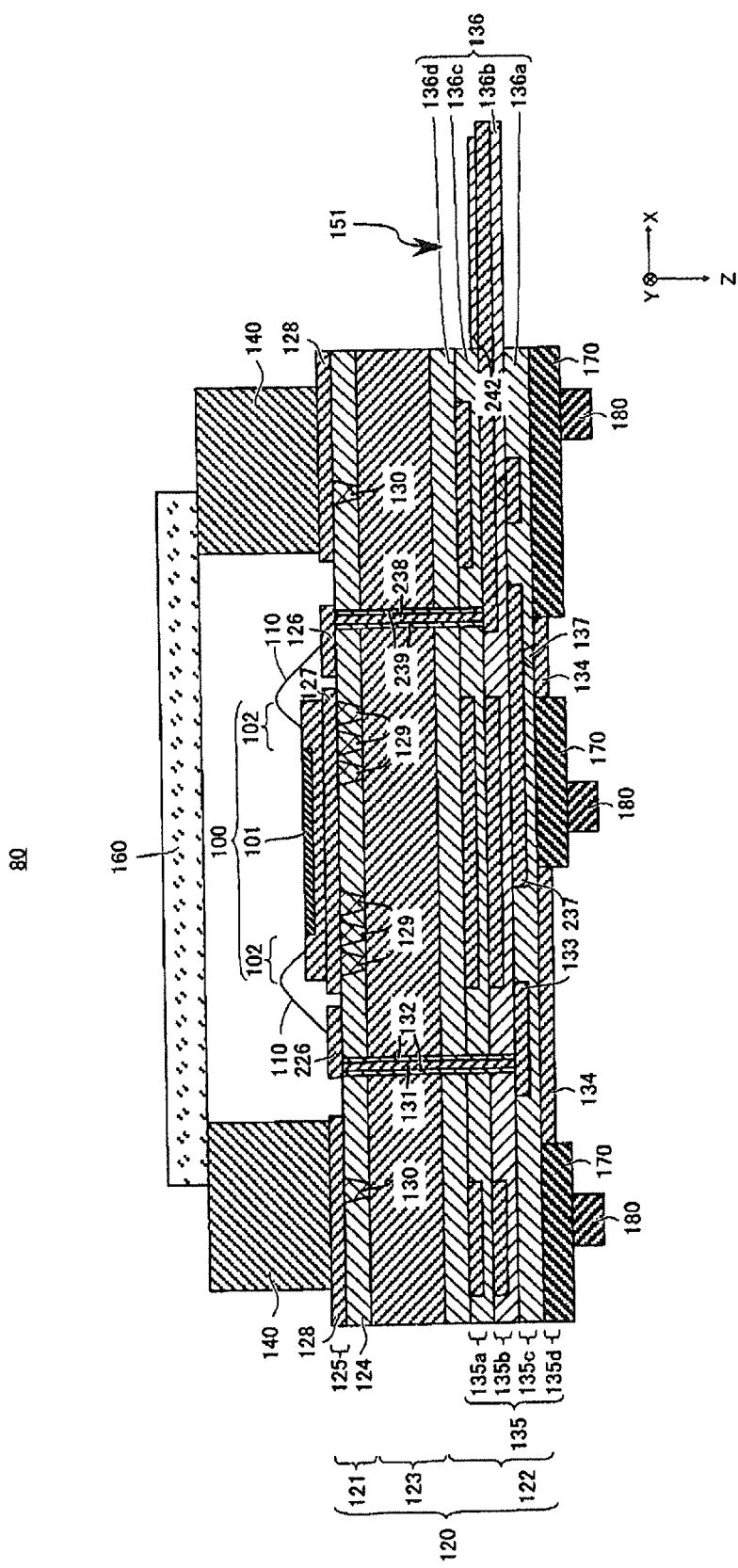
FIG. 17 is a schematic sectional view of an imaging unit.

FIG. 17 is a schematic sectional view of an imaging unit 80 according to a seventh variant. In FIG. 17, elements that are denoted with the same symbols as in FIG. 9 have the same functions and configurations as the elements explained in conjuncture with FIG. 9. The configuration of the imaging unit 80 is different from the configuration of the imaging unit 10 illustrated in FIG. 9 in that two layers that are the insulating layer 136b and the interconnection layer 135b are extended. In this case, a part of a surface, on the interconnection layer 135b, that is on the side not covered with the insulating layer 136b may be coated with the insulator 242.

Figure 18B:
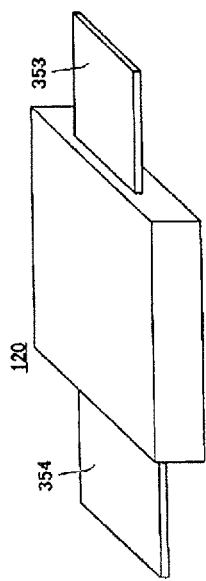
FIG. 18B is a figure illustrating one example of variants of a core substrate.
Figure 18D:
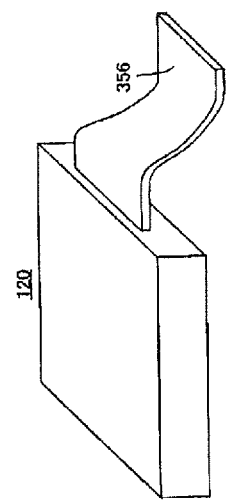
FIG. 18D is a figure illustrating one example of variants of a core substrate.
Figure 18F:
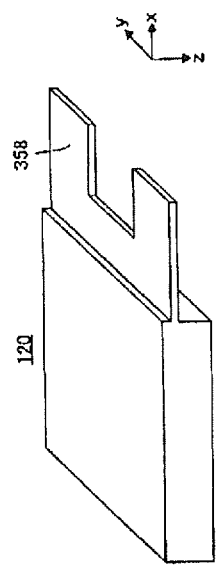
FIG. 18F is a figure illustrating one example of variants of a core substrate.
Figure 18A:
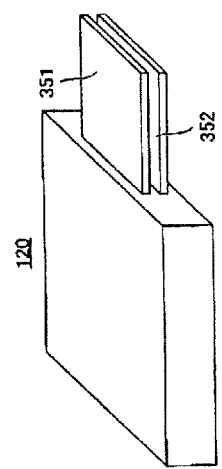
FIG. 18A is a figure illustrating one example of variants of a core substrate.

Variants of the configuration of the core substrate 120 are explained. The core substrate 120 may have various configurations depending on the placement position of a member to which the extended portion is connected. FIGS. 18A to 18F are figures illustrating examples of variants of the core substrate 120. Portions that are extended integrally from one side surface of the core substrate 120 are counted as one extended portion, and portions that are extended from the side surface or another side surface independently from the above-mentioned extended portion are counted as another extended portion. A plurality of the extended portions may be formed. FIG. 18A illustrates a case where two extended portions are formed on the same side surface of the core substrate 120. In this case, an upper extended portion 351 may include an interconnection pattern that transmits an output signal from the imaging chip 100, and a lower extended portion 352 may include an interconnection pattern for supplying power. Thereby, the output impedance of a power supply can be lowered while reducing degradation of an output signal.

The extended portions may be formed on two or more side surfaces of the core substrate. The extended portions may be formed for example on opposing side surfaces. In this case, the respective extended portions may be configured with the same extended layer. When the extended layer includes an interconnection pattern to transmit an output signal from the imaging chip 100, dual-channel readout to read out the output signal with two channels can be adopted. Also, the respective extended portions may be configured with mutually different extended layers. FIG. 18B illustrates a case where extended portions are formed with mutually different extended layers. Here, an extended portion 353 is formed above the core layer 123, and an extended portion 354 is formed below the core layer 123. In this case, the extended portion 353 may include an interconnection pattern to transmit an output signal from the imaging chip 100, and the extended portion 354 may include an interconnection pattern for supplying power. Thereby, the output impedance of a power supply can be lowered while reducing degradation of an output signal. Also, the extended portions may be formed not on the opposing side surfaces but on adjacent side surfaces. The extended portions may be formed on all the side surfaces. The extended portions may be caused to function as a grounded shield layer, or function as a heat sink. When the extended portions are caused to function as a heat sink, they may be formed as positions close to the imaging chip 100. Specifically, they may be formed between the core layer 123 and the imaging chip 100.

Figure 18C:
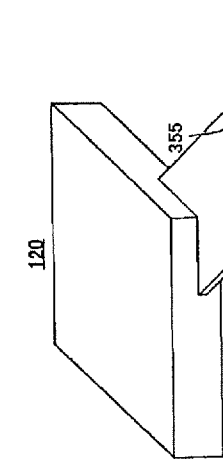
FIG. 18C is a figure illustrating one example of variants of a core substrate.

The configuration of the extended portion is not limited to a configuration in which they extend from the side surfaces in the x-axis positive direction. The extended portion may extend from a central portion of a side surface in the y-axis direction, and may be brought closer to one end portion of a side surface in the y-axis direction and extend therefrom. FIG. 18C illustrates a case where an extended portion 355 extends in an oblique direction relative to the core substrate 120. This structure is useful in terms of readiness of attachment between the extended portion 355 and a member to which the extended portion 355 is connected. A plurality of the extended portions 355 may be formed. FIG. 18D illustrates a cases where an extended portion 356 curves. As described above, an insulating layer configuring the extended portion 356 is formed with a flexible material. Accordingly, for example when an image processing ASIC is placed behind the imaging unit, the extended portion 356 can be connected to the image processing ASIC by curving as illustrated in FIG. 18D. Even if installation surfaces of the extended portion and the image processing ASIC are different, they can be readily connected because the extended portion curves.

Figure 18E:
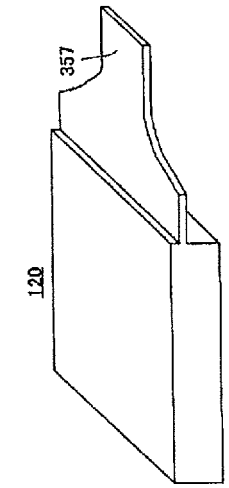
FIG. 18E is a figure illustrating one example of variants of a core substrate.

Although in the explanation above, the entire extended portion has a constant width, the width of the extended portion may change. FIG. 18E illustrates a case where an extended portion 357 extends from the outer edge of the core layer with the same width as the width of one side of the core layer, and then its width is reduced. By forming the root part of the extended portion 357 to be wide, the stress concentration at the root part can be mitigated. FIG. 18F illustrates a case where the extended portion 358 forks into two at its middle part. Thereby, parts to which the extended portion 358 is connected can be changed according to respective functions. For example, one of the two forked portions is connected to a substrate of a DC/DC converter, and the other is connected to an image processing ASIC.

The extended layer may be bent so as to avoid other components of a camera. Although in the explanation above, the interconnection layer that configures the extended layer is a monolayer, the interconnection layer that configures the extended layer may be a multilayer. When the interconnection layer that configures the extended layer is a double layer, one layer may be used as an interconnection to transmit an output signal, and the other layer may be used as a base for mounting electronic parts. Also, a damper resistance may be mounted on the other layer.

Although in the explanation above, an output signal transmitted by the extended layer is an output signal before image processing, the output signal transmitted by the extended layer may be an output signal after image processing when an image processing ASIC is mounted in the parts mounting surface of the core substrate 120. Also, although an area where an interconnection is exposed is formed on the upper surface of the extended portion, an area where the interconnection is exposed may be formed also on the lower surface. In this case, a connector to which connection is made contacts both the surfaces of the interconnection.

A crystal low-pass filter may be used as the cover glass 160 of the imaging unit. When the crystal low-pass filter is divided into a plurality of pieces, and the plurality of pieces is placed in the camera 400, one of the plurality of pieces may be placed in place of the cover glass 160. Although in the explanation above, the core layer 123 of the core substrate 120 is explained as being formed with metal, it may be formed with an insulating material such as a high-rigidity resin. In other words, the core layer 123 may be a resin core. For example, FR4 can be used as a high-rigidity insulating material.

Although in the explanation above, the electronic parts are explained as being mounted on a surface, of the second layer 122, that is on the side opposite to the core layer, the electronic parts may be mounted inside the second layer 122. In this case also, because the core layer is placed between the electronic parts 180 and the imaging chip 100, heat and electromagnetic waves generated in the electronic parts can be blocked by the core layer.

A structure may be attached to the surrounding member 140. In this case, a part of the frame is formed to extend outward beyond the first layer. Then, an attachment portion to be attached to the structure is formed in the extended portion. In this case, the above-mentioned metal or material formed by insert molding of metal and resin may be used as a material of the surrounding member 140. Thereby, heat can be dissipated effectively from the surrounding member 140 to the structure. Furthermore, by increasing the number of the thermal vias 130, the heat dissipating property can be enhanced.

In the imaging unit 20, the imaging chip 100 is directly mounted on the core layer 123 that is exposed by an opening being formed at a central portion of the first layer 121. Because the imaging chip 100 is placed on the front surface of the core layer 123, the front surface of the core layer 123 is preferably an accurate flat surface. For this reason, a flattening process such as polishing may be performed on the core layer 123. As described above, a flattening process may be performed also when the core layer 123 is a resin core. Note that the flattening process may not be performed entirely on a portion, of the core layer 123, that corresponds to the opening of the first layer 121, but may be performed in an area where the imaging chip 100 is placed.

Also, even a low-rigidity layer that does not have sufficient rigidity as the core layer 123 can serve as the core layer 123 if the rigidity as a whole is made higher by forming a metal layer or a high-rigidity resin layer in the low-rigidity layer. Metal layers or high-rigidity resin layers are preferably formed on both the upper and lower surfaces of the low-rigidity layer in terms of restraining a warp of the core substrate 120. For example, copper layers may be formed as metal layers on both the upper and lower surfaces of a resin layer that is the low-rigidity layer. Also, high-rigidity resin layers may be formed on both the upper and lower surfaces of a thin-film metal layer that is the low-rigidity layer.

Figure 19:
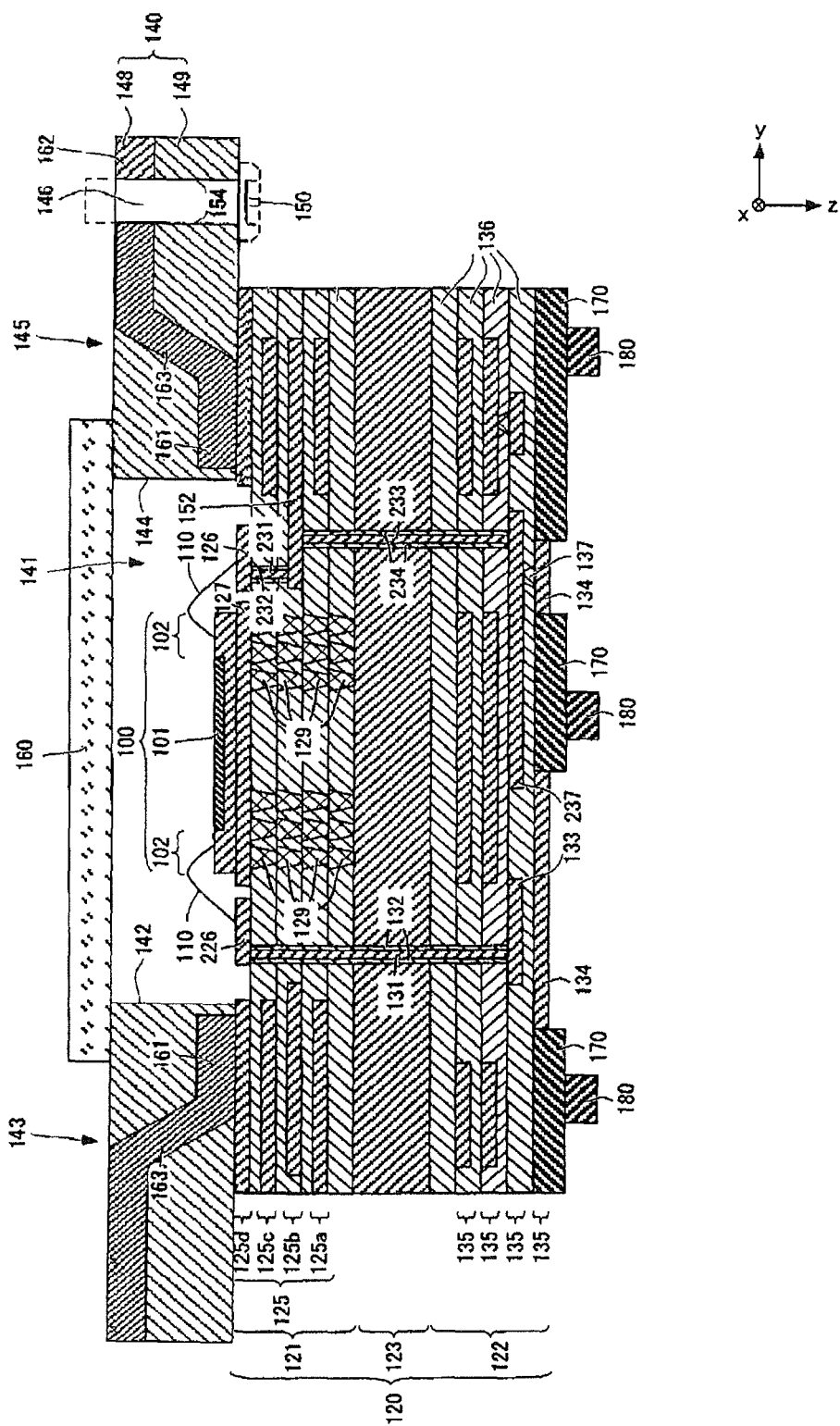
FIG. 19 is a schematic sectional view of an imaging unit 11.

FIG. 19 is a schematic sectional view of an imaging unit 11 according to a variant of the imaging unit 10. In the imaging unit 11, elements that are denoted with the same symbols as in FIG. 9 have the same functions and configurations as the elements explained in conjuncture with FIG. 9.

The surrounding member 140 in the imaging unit 11 has a first peripheral edge portion 143 along a first side 142 of an aperture at a central portion, and a second peripheral edge portion 145 along a second side 144 opposite to the first side 142. The first peripheral edge portion 143 and the second peripheral edge portion 145 have attachment holes 146 as attachment portions, respectively. Here, a single attachment hole 146 is formed at a central portion of the second peripheral edge portion 145. Two attachment holes 146 are formed at portions other than a central portion in the first peripheral edge portion 143. The attachment holes 146 are used for attaching another structure. Another structure is screwed to the surrounding member 140 via the attachment holes 146. Examples of another structure include for example a mirror box as described below.

The first peripheral edge portion 143 and the second peripheral edge portion 145 respectively have positioning holes for positioning the imaging unit 11 relative to a structure. When the imaging unit 11 is attached to a mirror box, the mirror box has positioning pins that protrude to the imaging unit 11 side. The positioning holes are formed at positions that correspond to the positioning pins. Also, a shutter unit is fastened to the imaging unit 11 and the mirror box. The shutter unit is also positioned accurately relative to the mirror box by the positioning pins inserted to positioning holes 147.

The surrounding member 140 surrounds the imaging chip 100. The surrounding member 140 is configured with a metal body 148 being inserted to a resin 149. The metal body 148 is formed like a ring to surround the aperture 141 for example. Also, the metal body 148 is formed three-dimensionally in the first peripheral edge portion 143 and the second peripheral edge portion 145, and this is described below in detail. An alloy of nickel and iron (for example, 42Alloy, 56Alloy), copper, and aluminum can be used as a material of the metal body 148. When emphasis is placed on weight reduction of the surrounding member 140, aluminum, which is most light among the above-mentioned materials, may be used. On the other hand, when emphasis is placed on the heat dissipating property of the surrounding member 140, copper, which has the highest thermal conductance among the above-mentioned materials, may be used.

Also, when 56Alloy having a value of the linear expansion coefficient that is the closest to the value of the linear expansion coefficient of the cover glass 160 is used, a warp that attributes to the difference between the linear expansion coefficients of the cover glass 160 and the surrounding member 140 can be reduced. When 42Alloy having a value of the linear expansion coefficient that is the closest to the linear expansion coefficient of the imaging chip 100 is used as the material of the core layer 123, the interconnection pattern 125, and the interconnection patterns 135 of the core substrate 120, 42Alloy may be used also as a material of the surrounding member 140. Thereby, a warp of the imaging unit 11 can be reduced.

The thickness of the surrounding member 140 is explained. The thickness of the surrounding member 140 is adjusted appropriately from various points of view such as in terms of ensuring the distance between the light receiving surface of the imaging chip 100 and the cover glass 160, or in terms of the rigidity of the surrounding member 140. Here, when dust, foreign matters, and the like adhere to the cover glass 160 or the cover glass 160 has scratches, reflection of the dust and the like can be reduced if the cover glass 160 is kept farther away from the light receiving surface of the imaging chip 100. Therefore, in terms of reduction of the influence of reflection, the distance between the light receiving surface of the imaging chip 100 and the cover glass 160 is preferably longer. Accordingly, the thickness of the surrounding member 140 is preferably larger. Reflection is influenced also by the size of the imaging chip 100. For example, because a smaller size of the imaging chip 100 means a larger depth of field, the influence becomes more noticeable when the distance between the light receiving surface of the imaging chip 100 and the cover glass 160 is shorter. Accordingly, the thickness of the surrounding member 140 is preferably larger. In addition, also in terms of the rigidity of the surrounding member 140, the thickness of the surrounding member 140 is preferably larger.

On the other hand, the distance between the light receiving surface of the imaging chip 100 and the cover glass 160 is limited by each type of equipment on which the imaging unit 11 is mounted in view of another structure. According to the present embodiments, the distance can be adjusted to the distance that is limited by each type of equipment by adjusting the thickness of the surrounding member 140. Also, the surrounding member 140 itself, when having a certain thickness, can function as a structure to which another structure is coupled directly.

The metal body 148 includes a lower end portion 161 formed on the core substrate 120 side, an upper end portion 162 formed on the cover glass 160 side, and a link portion 163 that joins the lower end portion 161 and the upper end portion 162. The lower end portion 161 and the upper end portion 162 are formed in parallel on mutually different planes. By forming the metal body 148 three-dimensionally, the rigidity of the surrounding member 140 can be made higher. When the imaging unit 11 is attached to another structure, the upper end portion 162 comes in contact with the other structure. Accordingly, the larger the area of the upper end portion 162 is, the more enhanced the heat dissipating property is.

The metal body 148 is not exposed on the end surface of the lower end portion 161, that is, the end surface of the surrounding member 140 on the imaging chip 100 side. Because the metal body 148 is covered with the resin 149, reflection that can be generated on the end surface of the opening of the surrounding member 140 can be reduced. Also, the lower end portion 161 is contacting directly the interconnection 128.

The attachment hole 146 to penetrate through the upper end portion 162 and the resin 149 is formed such that a screw 150 can penetrate through a portion where the upper end portion 162 and the resin 149 are layered. Accordingly, the upper end portion 162 forms a part of an inner wall surface 154 of the attachment hole 146. For this reason, when the imaging unit 11 is screwed to another structure, the upper end portion 162 comes in contact with the screw 150. By forming a heat transfer path in this manner, heat can be dissipated to a structure side via the metal screw 150, and this is described below in detail. Note that by adopting a configuration in which the inner wall surface 154 of the attachment hole 146 is entirely formed with the metal body 148, the heat dissipating property can be enhanced further.

Figure 20:
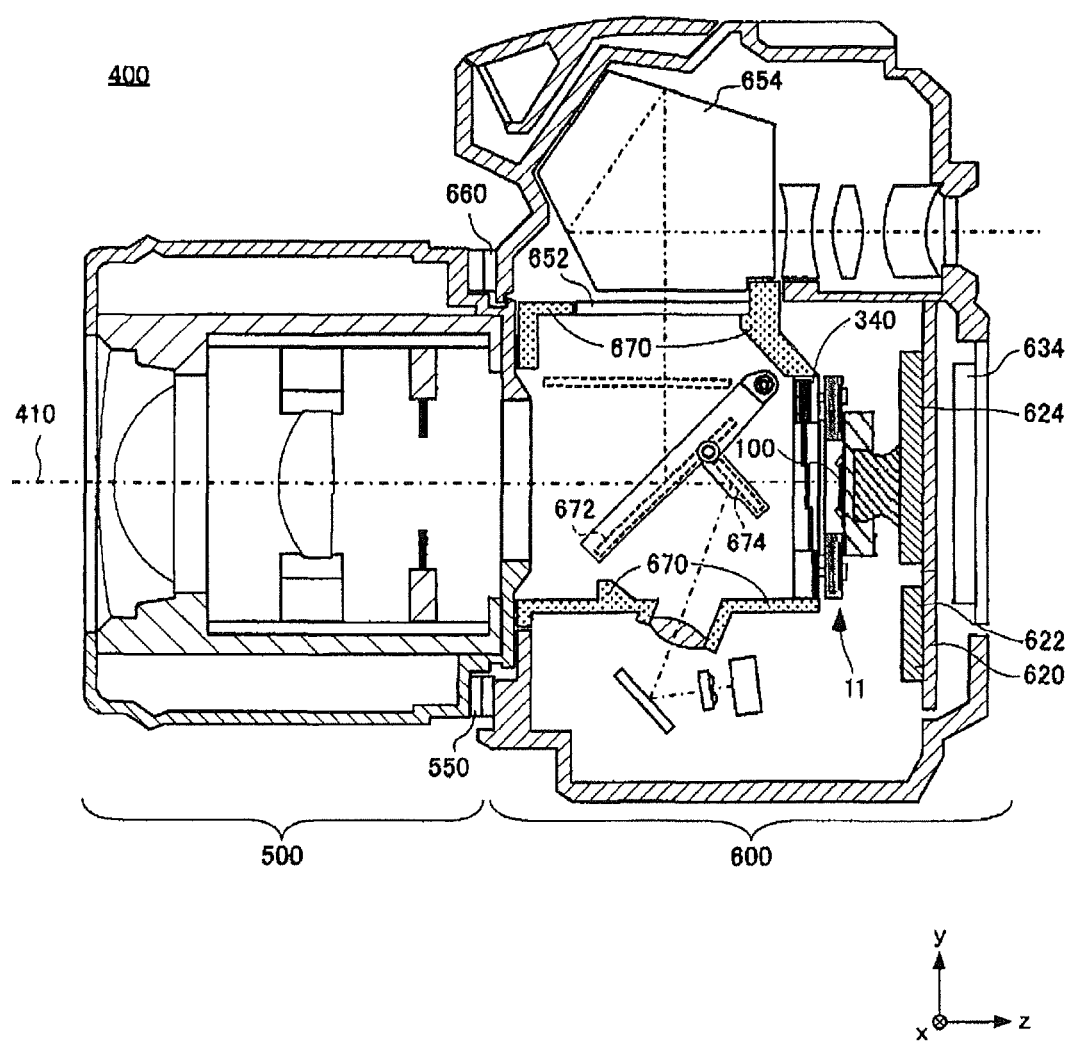
FIG. 20 is a schematic sectional view of a camera 400 including the imaging unit 11.

FIG. 20 is a schematic sectional view of a variant of the camera 400 according to the imaging unit 11. The focusing plate 652, the pentaprism 654, the main mirror 672, and the sub-mirror 674 are supported by the mirror box 670 as a structure. In this manner, the mirror box 670 is a structure to which various structures are attached and is to be a center of the camera 400. For this reason, the mirror box 670 is formed with a high-rigidity material such as metal. Also, because heat of the imaging unit 11 is dissipated to the mirror box 670, it is preferably formed with a material having high specific heat capacity.

As described above, the mirror box 670 is attached to the imaging unit 11 via the attachment holes 146. Because the imaging unit 11 is attached directly to the mirror box 670, errors in relative positional relationship between the mirror box 670 and the imaging chip 100 can be reduced. Because the mirror box 670 is a structure to be a reference, it can be strictly positioned relative to the optical axis.

Note that although a material formed by insert molding of metal and resin is used for the surrounding member 140, the material of the surrounding member 140 is not limited thereto. For example, the surrounding member 140 may be formed with metal alone. In this case, the heat dissipating property can be enhanced further as compared with a case where a material formed by insert molding of metal and resin is used. Also, the surrounding member 140 may be formed with a resin alone that meets rigidity required for attachment to a structure. In this case, the weight of the surrounding member 140 can be reduced while keeping the distance between the imaging chip 100 and the cover glass 160.

In this manner, the surrounding member 140 has the attachment hole 146 at its extended part that extends outward beyond the core substrate 120 and the cover glass 160. Note that although the surrounding member 140 may have a constant thickness, the thickness of the surrounding member 140 is not limited to be constant as long as the rigidity and the like required for attachment to a structure are met. For example, the thickness of the surrounding member 140 at the extended part having the attachment hole 146 may be smaller than the thickness of the main body portion sandwiched by the core substrate 120 and the cover glass 160. Thereby, the weight of the surrounding member 140 can be reduced while keeping the distance between the imaging chip 100 and the cover glass 160. The extended part may be formed by milling. On the other hand, when metal is used as a material of the surrounding member 140, the heat dissipating property of the surrounding member 140 can be enhanced by making larger the thickness of the extended part than the thickness of the main body portion. By making larger the thickness of the extended part, the rigidity of the surrounding member 140 can also be enhanced.

Note that the configuration relating to the attachment portion described above about the surrounding member 140 of the imaging unit 11 may be applied to the surrounding member 140 of each imaging unit of the imaging unit 20, the imaging unit 30, the imaging unit 40, the imaging unit 50, and the imaging unit 60 according to the second embodiment. Also, in the imaging unit 11, the surrounding member 140 has an attachment portion for attaching another structure. In the imaging unit according to the first embodiment, the mounting substrate has an attachment portion for attaching another structure. Both the surrounding member and the mounting substrate may have attachment portions for attaching another structure.

As a variant of the core substrate according to the second embodiment, the core substrate may include, as a multilayered structure, only the core layer 123 and the first layer 121. In this manner, a mounting substrate including, as a multilayered structure, at least one interconnection layer and at least one core layer may have the extended portion 151.

As another variant of the imaging unit according to the second embodiment, the mounting substrate may be not a core substrate, but a multilayered substrate not including the core layer 123, the first core layer 323, and the second core layer 324. For example, the mounting substrate having a multilayered structure not including a core layer may have the extended portion 151 including a layer which is a part of the multilayered structure.

Also, the configuration of the imaging unit according to the first embodiment and the configuration of the imaging unit according to the second embodiment may be combined into a given combination. For example, the elastic modulus of the first layer 121 in the second embodiment may be different from the elastic modulus of the second layer 122 in the second embodiment.

Third Embodiment

As described above in the second embodiment, not only a connector but also bypass capacitors are placed in the parts mounting surface of the imaging unit. For this reason, when the bypass capacitors are mounted on the parts mounting surface, a mount area for the bypass capacitors needs to be ensured. The imaging unit according to the third embodiment enables stabilization of a power supply, while ensuring the mount area of the electronic parts by reducing the number of the bypass capacitors.

Figure 21:
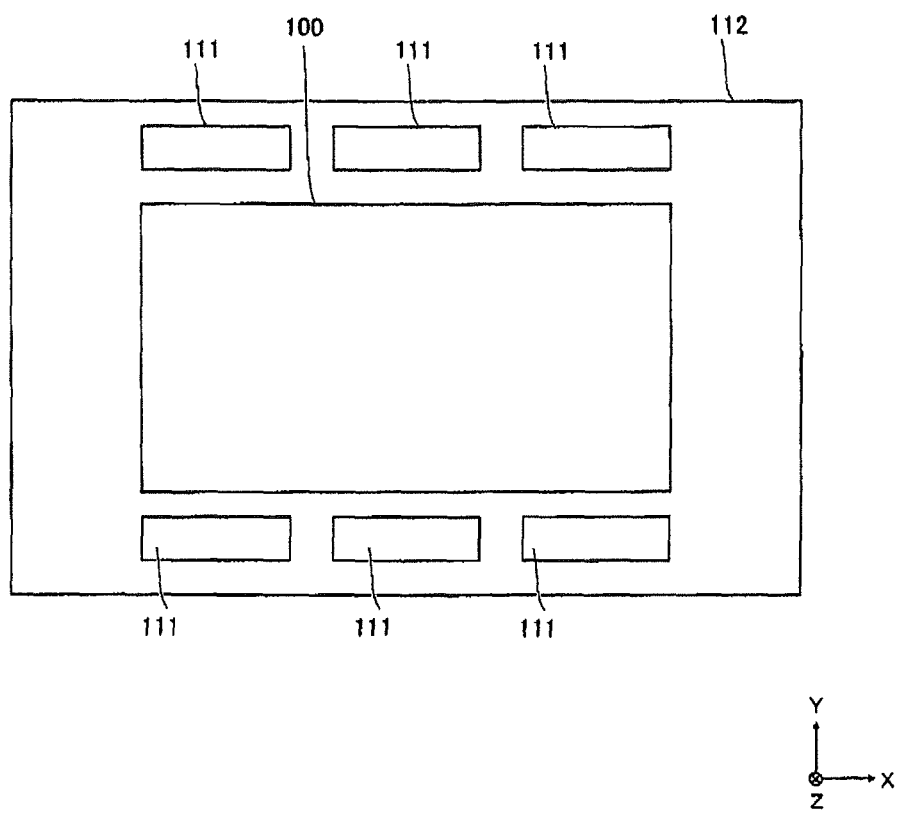
FIG. 21 is a figure for schematically explaining the placement positions of bonding pads in an imaging unit 90.

FIG. 21 is a figure for schematically explaining the placement positions of bonding pads in an imaging unit 90 according to the third embodiment. The core substrate 112 is a multilayered substrate including a GND layer 114, a power supply layer 115, and the like. The imaging chip 100 is placed at a central portion of the core substrate 112. Bonding pad areas 111 are peripheral areas, of the area of the chip mounting surface, where the imaging chip 100 is mounted. Here, on the sheet of FIG. 21, three bonding pad areas 111 are provided below the imaging chip 100, and three bonding pad areas 111 are provided above the imaging chip 100. The six bonding pad areas 111 are provided on the chip mounting surface. A plurality of bonding pads such as the GND pad 116, the power supply pad 117, and the like that are described below is provided to each of the bonding pad areas 111.

Figure 22:
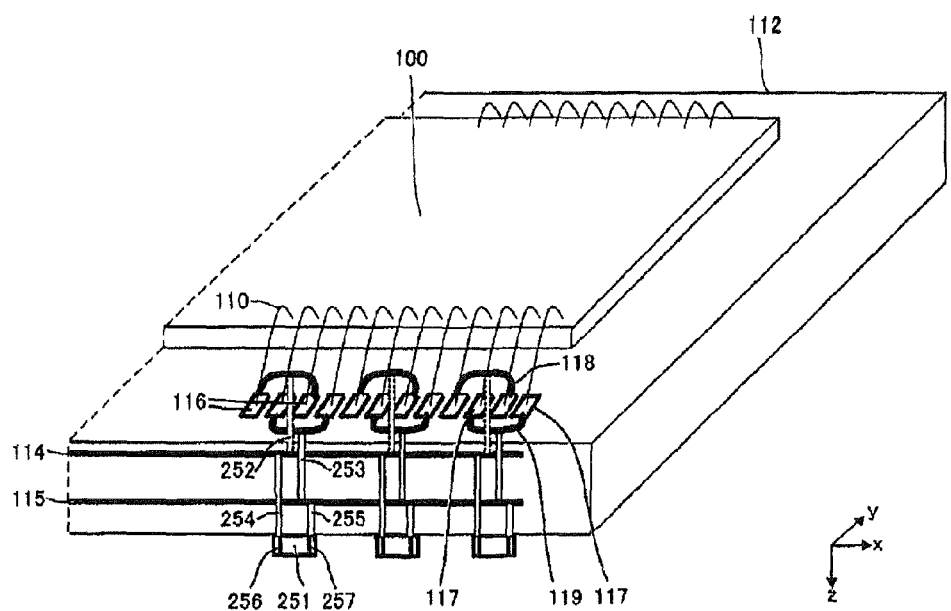
FIG. 22 is a perspective view of the imaging unit 90.

FIG. 22 is a perspective view of the imaging unit 90. The GND pads 116 for supplying the ground voltage to the imaging chip 100 and the power supply pads 117 for supplying the power supply voltage to the imaging chip 100 are alternately placed in the bonding pad area 111. The GND pads 116 and the power supply pads 117 are placed with intervals therebetween. Note that illustration of signal lines is omitted. The GND pads 116 and the power supply pads 117 are respectively connected, by the bonding wires 110, to pads on the imaging chip 100 side that correspond respectively to the GND pads 116 and the power supply pads 117. A plurality of sets of two linked GND pads 116 and a plurality of sets of two linked power supply pads 117 are provided on the chip mounting surface. A link portion 118 that links two GND pads 116 is connected to the GND layer 114 of the core substrate 112 via a via 252. The GND layer 114 is connected to a first terminal 256 of a bypass capacitor 251 via a via 254. A link portion 119 that links two power supply pads is connected to the power supply layer 115 of the core substrate 112 via a via 253. The power supply layer 115 is connected to a second terminal 257 of the bypass capacitor 251 via a via 255.

When a single GND pad 116 and a single power supply pad 117 are provided to a single bypass capacitor 251, the first terminal 256 of the bypass capacitor 251 and the GND pad 116 are connected, and the second terminal 257 of the bypass capacitor 251 and the power supply pad 117 are connected, so the number of interconnections formed in the core substrate 112 becomes larger. For this reason, the interconnection layout of the core substrate 112 is limited. In the imaging unit 90 according to the third embodiment, two GND pads 116 are linked by the link portion 118, and two power supply pads 117 are linked by the link portion 119 on the chip mounting surface. For a single bypass capacitor 251, two GND pads 116 are connected to the first terminal 256 of the bypass capacitor 251 via the link portion 118, the via 252, the GND layer 114, and the via 254, and two power supply pads 117 are connected to the second terminal 257 of the bypass capacitor 251 via the link portion 119, the via 253, the power supply layer 115, and the via 255. For this reason, the degree of freedom of the interconnection layout in the core substrate 112 becomes higher. The two bonding wires 110 connected to two GND pads 116 are connected in parallel. The two bonding wires 110 connected to two power supply pads 117 are connected in parallel. For this reason, the interconnection becomes shorter, and the inductance of the interconnection can be made smaller. In this case, the total inductance of the two bonding wires 110 becomes approximately the same with the inductance of a single bonding wire 110.

Figure 23:
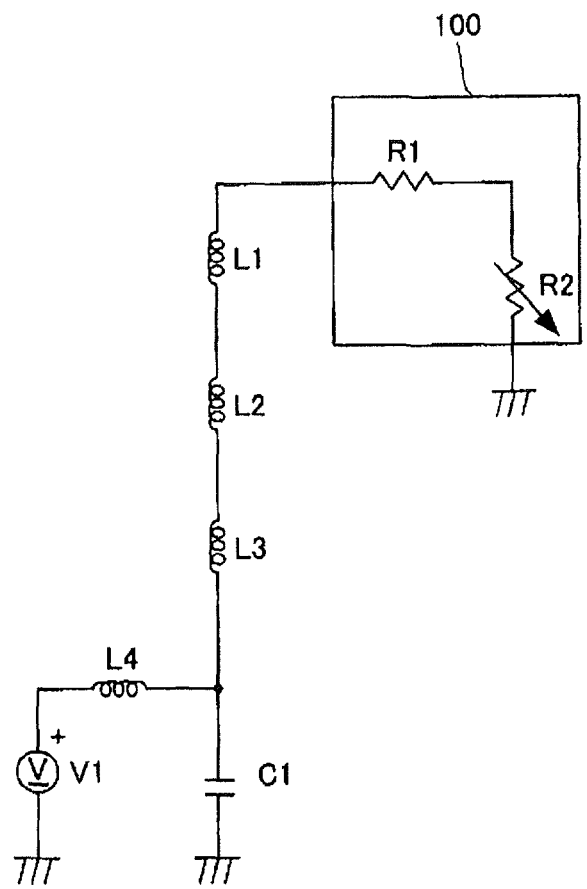
FIG. 23 is a figure illustrating an equivalent circuit of an imaging unit in a comparative example.

FIG. 23 is a figure illustrating, as a comparative example, an equivalent circuit of an imaging unit to which a single bypass capacitor is provided to each set of a single GND pad and a single power supply pad. A resistance R1 and a resistance R2 are resistances inside the imaging chip 100. Specifically, the resistance R1 is a contact resistance of a terminal (pad) and an interconnection resistance inside the imaging chip 100. The resistance R2 changes according to the operation state inside the imaging chip 100. That is, current that is drawn to the inside of the imaging chip 100 changes in accordance with the internal operation. An inductance L1 is an inductance of the bonding wire 110. An inductance L2 is an inductance that attributes to another interconnection. An inductance L3 is an inductance according to the distance of routing of an interconnection. An inductance L4 is an inductance of a power supply line. A power supply V1 is a power supply, and a capacitance C1 is the capacitance of a bypass capacitor.

Figure 24:
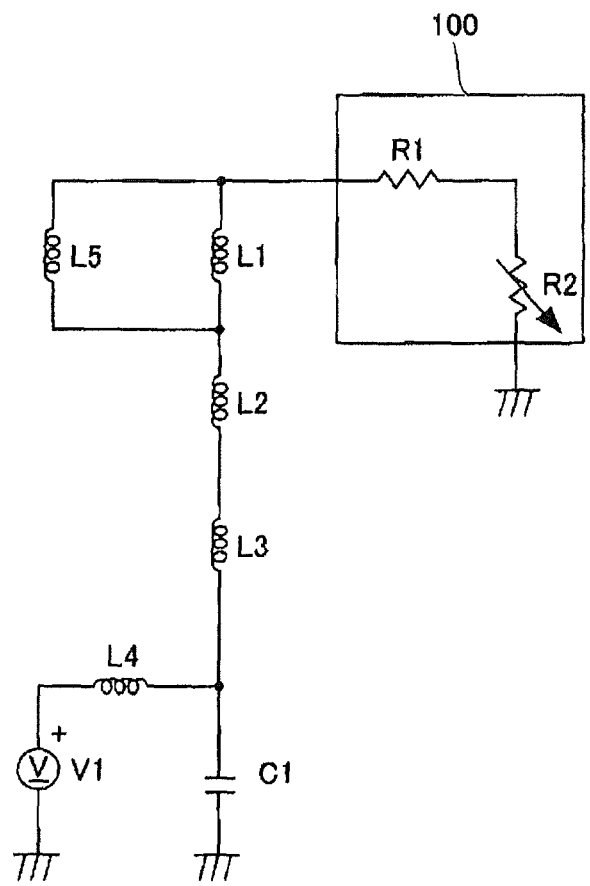
FIG. 24 is a figure illustrating an equivalent circuit of an imaging unit.

FIG. 24 is a figure illustrating an equivalent circuit of an imaging unit according to the third embodiment. An inductance L5 is connected to the inductance L1 in parallel. The other configuration is the same with that in FIG. 23.

Figure 25A:
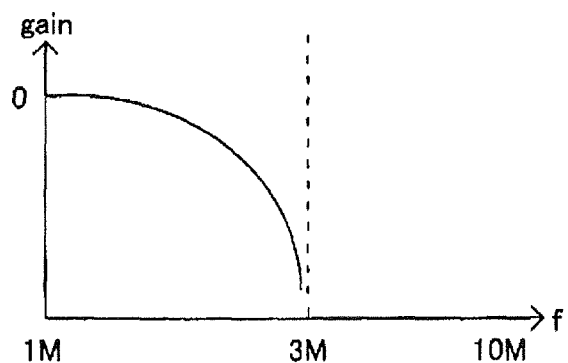
FIG. 25A is a figure for explaining a frequency characteristic.
Figure 25B:
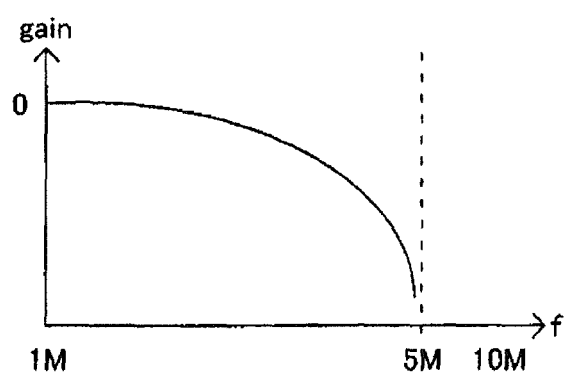
FIG. 25B is a figure for explaining a frequency characteristic.

FIGS. 25A and 25B are figures for explaining frequency characteristics. FIG. 25A shows a simulation result of the frequency characteristic in the configuration of the comparative example. The vertical axis shows the gain, and the horizontal axis shows the frequency f. The simulation conditions were as follows: R1 was 5Ω, R2 was 10Ω, L1 was 10 nH, L2 was 10 nH, L3 was 10 nH, L4 was 100 µH, C1 was 1 µF, and V1 was 3 V. In this case, the bypass capacitor can stabilize the power supply for the frequency of up to approximately 3 MHz as shown in FIG. 25A.

FIG. 25B shows a simulation result of the frequency characteristic in the imaging unit according to the third embodiment. The vertical axis shows the gain, and the horizontal axis shows the frequency f. The simulation conditions were as follows: R1 was 5Ω, R2 was 10Ω, L1 was 10 nH, L2 was 0 nH, L3 was 5 nH, L4 was 100 µH, L5 was 100 µH, C1 was 1 µF, and V1 was 3 V. While the inductance L1 was set to 10 nH in the comparative example, the inductance L1 was set to 0 H in the imaging unit according to the third embodiment. This is because, by sharing an interconnection, the inductance that attributes to another interconnection is not generated. While the inductance L2 was set to 10 nH in the comparative example, the inductance L2 was set to 5 H in the imaging unit according to the third embodiment. This is because, by linking the power supply pads and the GND pads on the chip mounting surface, the distance of routing of the interconnection is shortened as described above. Values of the other parameters are similar to those in the comparative example. As shown in FIG. 25B, the bypass capacitor can stabilize the power supply for the frequency of up to approximately 5 MHz. In the above-described manner, it can be confirmed, according to the simulation results, that the frequency characteristic was improved by the imaging unit according to the third embodiment.

Although the third embodiment was explained by using the core substrate 112, various types of the core substrate 120 shown in the second embodiment may be used in place of the core substrate 112. When the core substrate 120 is used, the core layer of the core substrate 120 may be used as a GND layer. Also, the interconnection layer below the core layer may be used as a power supply layer. Also, although two power supply pads are linked and two GND pads are linked on the chip mounting surface, a plurality of power supply pads are linked and a plurality of GND pads are linked not on the chip mounting surface, but on a layer above the core layer, for example on a layer next to and below a layer where the chip mounting surface is formed. Also, three or more power supply pads may be linked. Three or more GND pads may be linked. However, the frequency characteristic of the bypass capacitor lowers as the number of pads to be linked increases. Accordingly, all the power supply pads and all the GND pad are not linked preferably. Note that, preferably, the number of pads to be linked is appropriately set considering the frequency characteristic of the bypass capacitor. A plurality of power supply pads may not be linked, but a plurality of GND pads may be linked. A plurality of GND pads may not be linked, but a plurality of power supply pads may be linked.

The cover glass 160 according to the first embodiment and the cover glass 160 according to the second embodiment are mutually corresponding elements. The surrounding member 140 according to the first embodiment and the surrounding member 140 according to the second embodiment are mutually corresponding elements. The surrounding member may be a frame that surrounds the imaging chip. The frame may be a support structure. The frame may be a structure that supports at least an optical element.

The core substrate 120 according to the first embodiment, the core substrate 120 according to the second embodiment, and the core substrate 112 according to the third embodiment are examples of a mounting substrate where the imaging chip 100 is mounted, and are mutually corresponding elements. The core substrate 120 according to the first embodiment, the core substrate 120 according to the second embodiment, and the core substrate 112 according to the third embodiment are an intermediate layer that is in contact with and sandwiched by two other layers.

The insulating layer 124 and the insulating layers 136 according to the first embodiment, and the insulating layer 124 and the insulating layers 136 according to the second embodiment are mutually corresponding elements. The interconnection patterns 135 according to the first embodiment and the interconnection layers 135 according to the second embodiment are mutually corresponding elements.

The configuration of each element explained in the first embodiment to the third embodiment may be combined into a given combination, and applied to an imaging unit, an imaging device or the like. For example, the configuration of each element, explained in the first embodiment to the third embodiment may be combined into a given combination, and applied to a corresponding element.

Figure 26:
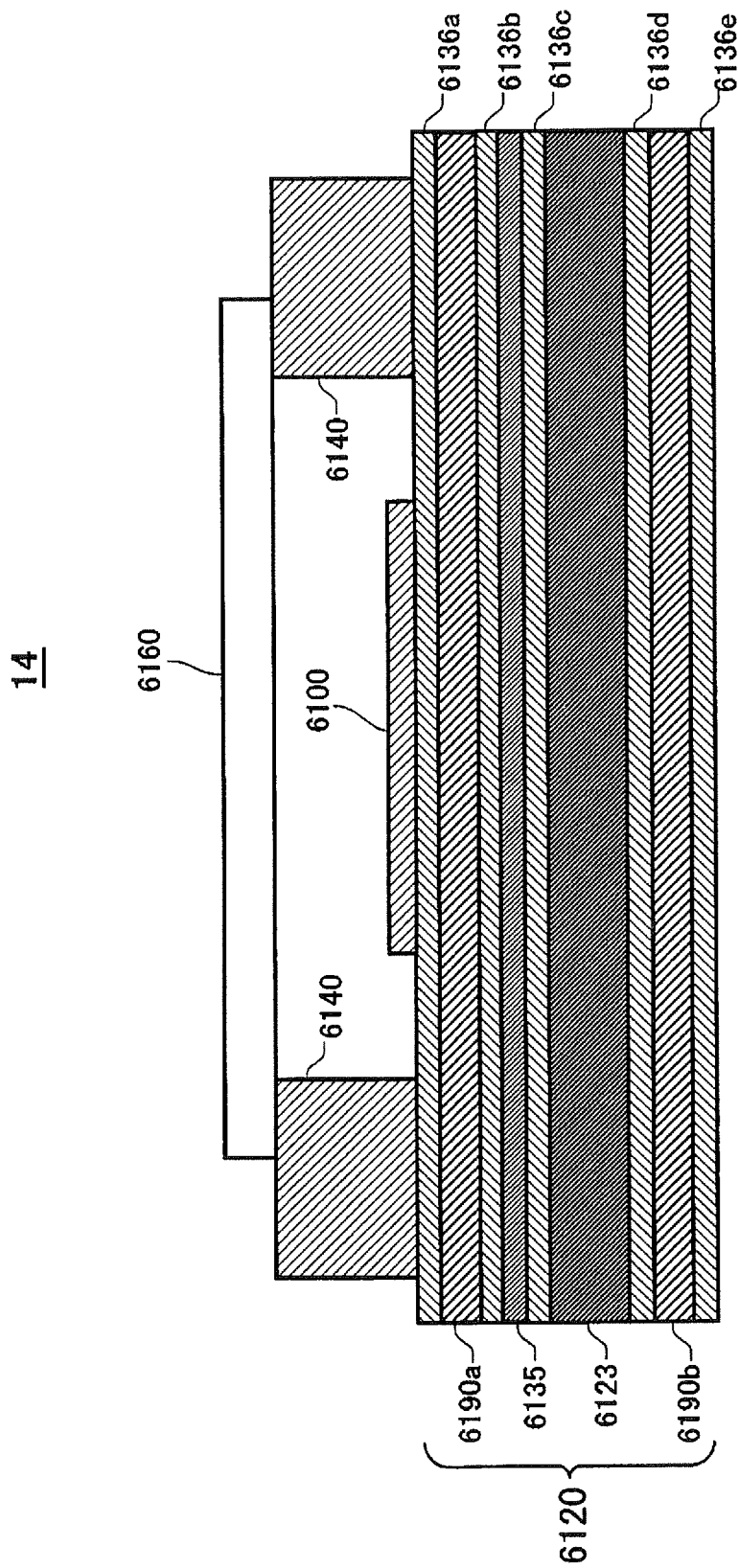
FIG. 26 is a schematic sectional view of an imaging unit 14.

FIG. 26 is a figure illustrating the configuration of an imaging unit 14 according to a fourth embodiment. The imaging unit 14 is configured to include an imaging chip 6100, a mounting substrate 6120, a surrounding member 6140 that surrounds the imaging chip 6100, and an optical element 6160. The mounting substrate 6120 has an insulating layer 6136a, an insulating layer 6136b, an insulating layer 6136c, an insulating layer 6136d, an insulating layer 6136e, a first metal layer 6135, a second metal layer 6123, a third metal layer 6190a, and a fourth metal layer 6190b.

The cover glass 6160 in the imaging unit 14 corresponds to the cover glass 160 according to the first embodiment and the cover glass 160 according to the second embodiment.

The surrounding member 6140 corresponds to the surrounding member 140 according to the first embodiment and the surrounding member 140 according to the second embodiment.

The mounting substrate 6120 corresponds to the core substrate 120 according to the first embodiment, the core substrate 120 according to the second embodiment, and the core substrate 112 according to the third embodiment.

The insulating layer 6136a, the insulating layer 6136b, the insulating layer 6136c, the insulating layer 6136d, and the insulating layer 6136e are resin layers for example. The insulating layer 6136a, the insulating layer 6136b, the insulating layer 6136c, the insulating layer 6136d, and the insulating layer 6136e correspond to the insulating layer 124 and the insulating layers 136 according to the first embodiment, the insulating layer 124 and the insulating layers 136 according to the second embodiment, or the like.

The first metal layer 6135 is an interconnection layer for example. The first metal layer 6135 corresponds to the interconnection patterns 135 according to the first embodiment, the interconnection layers 135 according to the second embodiment, or the like.

The second metal layer 6123 is one example of the intermediate layer. The second metal layer 6123 is one example of the core layer. The second metal layer 6123 corresponds to the core layer 123, the core layer 181, the first core layer 323, and the second core layer 324 according to the first embodiment, the core layer 123, the first core layer 323, and the second core layer 324 according to the second embodiment, or the like.

Therefore, a configuration that is similar to a given configuration of a corresponding element in the first embodiment to the third embodiment can be applied to the imaging chip 6100, the surrounding member 6140, the optical element 6160, the insulating layer 6136a, the insulating layer 6136b, the insulating layer 6136c, the insulating layer 6136d, the insulating layer 6136e, the first metal layer 6135 and the second metal layer 6123 that the imaging unit 14 has, so explanation thereof is omitted.

In the mounting substrate 6120, the imaging chip 6100, the insulating layer 6136a, the third metal layer 6190a, the insulating layer 6136b, the first metal layer 6135, the insulating layer 6136c, the second metal layer 6123, the insulating layer 6136d, the fourth metal layer 6190b, and the insulating layer 6136e are disposed in this order along the optical axis. The imaging chip 6100 is mounted on the insulating layer 6136a.

The third metal layer 6190a is positioned on a surface, of the insulating layer 6136a, that is opposite to a surface where the imaging chip 6100 is mounted. The third metal layer 6190a is in contact with and sandwiched by the insulating layer 6136a and the insulating layer 6136b. The first metal layer 6135 is in contact with and sandwiched by the insulating layer 6136b and the insulating layer 6136c. The second metal layer 6123 is in contact with and sandwiched by the insulating layer 6136c and the insulating layer 6136d. The third metal layer 6190b is in contact with and sandwiched by the insulating layer 6136d and the insulating layer 6136e.

Examples of a material of the third metal layer 6190a include copper, nickel alloy, aluminum, and the like. The third metal layer 6190a is a thick copper layer as one example. The third metal layer 6190a may be a substantially metallic flat plate. The third metal layer 6190a may be used as the ground. The third metal layer 6190a may be used as an interconnection. Examples of a material of the fourth metal layer 6190b include copper, nickel alloy, iron, aluminum, and the like. The fourth metal layer 6190b is a thick copper layer as one example. The fourth metal layer 6190b may be a substantially metallic flat plate. The fourth metal layer 6190b may be used as the ground. The fourth metal layer 6190b may be used as an interconnection.

Although the third metal layer 6190a and the fourth metal layer 6190b are provided to the mounting substrate 6120, only either metal layer of the third metal layer 6190a and the fourth metal layer 6190b may be provided. When only the third metal layer 6190a is provided, the third metal layer 6190a may be provided on the imaging chip 6100 side of the second metal layer 6123. The third metal layer 6190a may be provided on the imaging chip 6100 side of the second metal layer 6123 and the imaging chip 6100 side of the first metal layer 6135. The third metal layer 6190a may be provided on a metal layer that is provided farthest on the imaging chip 6100 side among metal layers that are provided to the mounting substrate 6120. By providing the third metal layer 6190a closer to the imaging chip 6100, the mounting substrate 6120 can improve the planarity of the mounting surface where the imaging chip 6100 is mounted. Furthermore, the flatness of the imaging chip 6100 mounted on the mounting substrate 6120 can be ensured.

In addition to the third metal layer 6190a and the fourth metal layer 6190b, one or more metal layers having rigidity that is similar to that of the third metal layer 6190a and the fourth metal layer 6190b may be provided to the mounting substrate 6120. Thereby, the mounting substrate 6120 can improve the planarity of the mounting surface where the imaging chip 6100 is mounted. Furthermore, the flatness of the imaging chip 6100 mounted on the mounting substrate 6120 can be ensured.

In addition to the third metal layer 6190a and the fourth metal layer 6190b, one or more metal layers having thickness that is similar to that of the third metal layer 6190a and the fourth metal layer 6190b may be provided to the mounting substrate 6120. Thereby, the mounting substrate 6120 can improve the planarity of the mounting surface where the imaging chip 6100 is mounted. Furthermore, the flatness of the imaging chip 6100 mounted on the mounting substrate 6120 can be ensured.

The second metal layer 6123 is more rigid than the third metal layer 6190a. The second metal layer 6123 is more rigid than the fourth metal layer 6190b. The second metal layer 6123 is more rigid than any of layers included in the mounting substrate 6120. The second metal layer 6123 may be used as the ground. The second metal layer 6123 may be used as an interconnection.

The thickness of the insulating layer 6136 is approximately 30 μm to 40 μm. The thickness of the first metal layer 6135 is approximately 30 μm to 40 μm. The thickness of the third metal layer 6190a is approximately 30 μm to 50 μm. The thickness of the fourth metal layer 6190b is approximately 30 μm to 50 μm. The thickness of the second metal layer 6123 is approximately 100 μm to 400 μm. For example, when the second metal layer 6123 is formed with metal, the thickness of the second metal layer 6123 is approximately 100 μm to 400 μm. The thickness of the second metal layer 6123 is larger than the thickness of the third metal layer 6190a. The thickness of the second metal layer 6123 is larger than the thickness of the fourth metal layer 6190b. The thickness of the second metal layer 6123 is the largest among the thickness of layers included in the mounting substrate 6120.

The second metal layer 6123 has thickness that is at least two times larger than the thickness of the third metal layer 6190a. The second metal layer 6123 may have thickness that is ten times or more larger than the thickness of the third metal layer 6190a. The thickness of the third metal layer 6190a may be larger than the thickness of the first metal layer 6135. The thickness of the third metal layer 6190a may be larger than the thickness of any of the insulating layer 6136a, the insulating layer 6136b, the insulating layer 6136c, the insulating layer 6136d, and the insulating layer 6136e. The thickness of the fourth metal layer 6190b may be larger than the thickness of the first metal layer 6135. The thickness of the fourth metal layer 6190b may be larger than the thickness of any of the insulating layer 6136a, the insulating layer 6136b, the insulating layer 6136c, the insulating layer 6136d, and the insulating layer 6136e. The thickness of the mounting substrate 6120 may be approximately 0.8 mm to 3 mm. The thickness of the mounting substrate 6120 may be two or more times larger than the thickness of the second metal layer 6123. The thickness of the mounting substrate 6120 may be three or less times larger than the thickness of the second metal layer 6123.

In addition to the first metal layer 6135, one or more metal layers having rigidity that is similar to that of the first metal layer 6135 may be provided to the mounting substrate 6120. In this case, the metal layer may be provided on the imaging chip 6100 side of the second metal layer 6123, or may be provided on the side of the second metal layer 6123 that is opposite to the imaging chip 6100. The first metal layer 6135 may not be provided to the mounting substrate 6120. In this case, one or more metal layers having rigidity that is similar to that of the first metal layer 6135 may be provided on the side of the second metal layer 6123 that is opposite to the imaging chip 6100.

Note that in place of the second metal layer 6123, an intermediate layer may be formed with resin. When the intermediate layer is formed with resin in place of the second metal layer 6123, the thickness of the intermediate layer is approximately 200 µm to 400 µm. When the intermediate layer is formed with resin in place of the second metal layer 6123, in the mounting substrate 6120, the intermediate layer may be in contact with and sandwiched by a plurality of metal layers, may be in contact with and sandwiched by a plurality of resin layers, or may be in contact with and sandwiched by a metal layer and a resin layer.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An imaging unit, comprising:
   an imaging chip that images an object; and
   a substrate comprising:
      a first insulating layer in which is formed wiring connected to the imaging chip;
      a second insulating layer having an elastic modulus that is different from an elastic modulus of the first insulating layer; and
      a first core layer that is sandwiched by the first insulating layer and the second insulating layer, and is more rigid than the first insulating layer and the second insulating layer.

2. The imaging unit according to claim 1, wherein at least one insulating layer of the first insulating layer and the second insulating layer is an insulating layer that is formed by impregnating a glass cloth with a thermosetting resin.

3. The imaging unit according to claim 1, further comprising:
   a second core layer that is sandwiched by the first insulating layer and the second insulating layer, and is more rigid than the first insulating layer and the second insulating layer; and
   a heat-insulating layer that is sandwiched by the first core layer and the second core layer, and has lower thermal conductance than thermal conductances of the first core layer and the second core layer.

4. The imaging unit according to claim 3, wherein the thermal conductance of the first core layer is higher than the thermal conductance of the second core layer.

5. The imaging unit according to claim 3, wherein specific heat capacity of the second core layer is higher than specific heat capacity of the first core layer.

6. The imaging unit according to claim 1, wherein an elastic modulus of the first insulating layer is lower than an elastic modulus of the second insulating layer.

7. An imaging device comprising the imaging unit according to claim 1.

8. The imaging unit according to claim 1, wherein the wiring has an extended portion that extends outward beyond an outer edge of the first core layer.

9. The imaging unit according to claim 1, wherein the substrate is provided with a bonding pad connected to an electrode of the imaging chip and the wiring.

10. An imaging unit comprising:
    an imaging chip that images an object; and
    a substrate on which the imaging chip is arranged, the substrate comprising:
       a first insulating layer;
       a second insulating layer having an elastic modulus that is different from an elastic: modulus of the first insulating layer; and
       a first core layer that is sandwiched by the first insulating layer and the second insulating layer and that is more rigid that the first insulating layer and the second insulating layer,
    wherein the first core layer is a layer to receive, via a heat transfer path, heat generated by the imaging chip.

11. The imaging unit according to claim 10, wherein the heat transfer path is formed by a through-hole provided to the first insulating layer.

12. The imaging unit according to claim 11, wherein the through-hole is provided corresponding to a heat generation area of the imaging chip.

13. The imaging unit according to claim 10, wherein the imaging chip is placed in contact with the first core layer.

14. The imaging unit according to claim 13, wherein the first core layer has a concave portion, and the imaging chip is housed in the concave portion.

15. The imaging unit according to claim 13, wherein a flattening process has been performed on an area, of the first core layer, where the imaging chip is placed.

16. The imaging unit according to claim 10, wherein at least one insulating layer of the first insulating layer and the second insulating layer is an insulating layer that is formed by impregnating a glass cloth with a thermosetting resin.

17. The imaging unit according to claim 10, further comprising:
   a second core layer that is sandwiched by the first insulating layer and the second insulating layer, and is more rigid than the first insulating layer and the second insulating layer; and
   a heat-insulating layer that is sandwiched by the first core layer and the second core layer, and has lower thermal conductance than thermal conductances of the first core layer and the second core layer.

18. The imaging unit according to claim 17, wherein the thermal conductance of the first core layer is higher than the thermal conductance of the second core layer.

19. The imaging unit according to claim 17, wherein specific heat capacity of the second core layer is higher than specific heat capacity of the first core layer.

20. The imaging unit according to claim 10, wherein an elastic modulus of the first insulating layer is lower than an elastic modulus of the second insulating layer.

21. An imaging device comprising the imaging unit according to claim 10.

* * * * *